US012805401B2

(12) United States Patent
Popovic et al.

(10) Patent No.: US 12,805,401 B2
(45) Date of Patent: Nov. 17, 2026

(54) STACKED INTEGRATED CIRCUIT DEVICE INCLUDING INTEGRATED CAPACITOR DEVICE

(71) Applicant: QUALCOMM Incorporated, San Diego, CA (US)

(72) Inventors: Darko Popovic, San Diego, CA (US); Miguel Miranda Corbalan, San Diego, CA (US); Durodami Lisk, San Diego, CA (US); Yue Li, San Diego, CA (US); Irfan Khan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 645 days.

(21) Appl. No.: 18/454,388

(22) Filed: Aug. 23, 2023

(65) Prior Publication Data

US 2024/0363605 A1 Oct. 31, 2024

Related U.S. Application Data

(60) Provisional application No. 63/498,978, filed on Apr. 28, 2023.

(51) Int. Cl.
*H10W 90/00* (2026.01)
*H10W 20/20* (2026.01)
(Continued)

(52) U.S. Cl.
CPC ............ *H10W 90/00* (2026.01); *H10W 20/20* (2026.01); *H10W 72/07254* (2026.01); (Continued)

(58) Field of Classification Search
CPC ......... H01L 25/16; H01L 24/16; H01L 24/17; H10W 90/00; H10W 20/20; H10W 72/07254
See application file for complete search history.

(56) References Cited

U.S. PATENT DOCUMENTS 9,548,288 B1 1/2017 Ramachandran et al.
11,133,259 B2 9/2021 Rubin et al.
(Continued)

FOREIGN PATENT DOCUMENTS

CN 105742227 A 7/2016
CN 114141746 A 3/2022
(Continued)

OTHER PUBLICATIONS

Song E, et al., "Power Integrity Performance Gain of a Novel Integrated Stack Capacitor (ISC) Solution for High-end Computing Applications", 2020 IEEE 70TH Electronic Components and Technology Conference (Ectc), IEEE, Jun. 3, 2020, XP033807866, pp. 1358-1362.

(Continued)

*Primary Examiner* — Errol V Fernandes
(74) *Attorney, Agent, or Firm* — Moore IP

(57) ABSTRACT

A stacked integrated circuit (IC) device includes a first die including active circuitry and a power distribution network (PDN). The first die has a first set of contacts on a first side of the first die. The stacked IC device also includes a second die coupled, on a first side of the second die, to the first side of the first die. The second die also includes, on a second side of the second die, a second set of contacts to electrically connect circuitry of the second die to a substrate. The stacked IC device also includes an integrated capacitor device (ICD) coupled to the first side of the first die. The ICD is electrically connected, via the first set of contacts, to the PDN and includes one or more through-ICD conductors to electrically connect the PDN to the substrate.

30 Claims, 13 Drawing Sheets

(51) Int. Cl.
*H10W 72/00* (2026.01)
*H10W 72/20* (2026.01)
*H10W 74/10* (2026.01)

(52) U.S. Cl.
CPC ......... *H10W 72/247* (2026.01); *H10W 74/111* (2026.01); *H10W 90/722* (2026.01); *H10W 90/724* (2026.01); *H10W 90/728* (2026.01)

(56) References Cited

U.S. PATENT DOCUMENTS

| | | | |
|---|---|---|---|
| 11,626,359 | B2 | 4/2023 | Xie et al. |
| 2013/0194032 | A1 | 8/2013 | Hollis |
| 2014/0070422 | A1 | 3/2014 | Hsiao et al. |
| 2014/0127866 | A1 | 5/2014 | Lo et al. |
| 2014/0252548 | A1 | 9/2014 | Yen et al. |
| 2014/0264812 | A1 | 9/2014 | Chang et al. |
| 2016/0300796 | A1 | 10/2016 | Karhade et al. |
| 2017/0012029 | A1 | 1/2017 | Lambert et al. |
| 2017/0125383 | A1 | 5/2017 | Liu |
| 2017/0185107 | A1 | 6/2017 | Kwon |
| 2017/0366906 | A1 | 12/2017 | Lambert |
| 2018/0046908 | A1 | 2/2018 | Cox et al. |
| 2018/0269276 | A1 | 9/2018 | Lin et al. |
| 2018/0358292 | A1 | 12/2018 | Kong et al. |
| 2018/0358298 | A1 | 12/2018 | Zhai et al. |
| 2019/0041923 | A1 | 2/2019 | Atsatt et al. |
| 2019/0304915 | A1 | 10/2019 | Jain et al. |
| 2020/0273801 | A1* | 8/2020 | Kim .................... H10W 70/611 |
| 2020/0303291 | A1 | 9/2020 | Perez-Corona et al. |
| 2020/0357777 | A1 | 11/2020 | Lee et al. |
| 2020/0402951 | A1 | 12/2020 | Chen et al. |
| 2021/0098350 | A1 | 4/2021 | Cheah et al. |
| 2021/0193616 | A1 | 6/2021 | Cheah et al. |
| 2021/0242170 | A1 | 8/2021 | Dabral et al. |
| 2021/0273042 | A1 | 9/2021 | Kim et al. |
| 2021/0296283 | A1 | 9/2021 | Huang et al. |
| 2021/0335698 | A1 | 10/2021 | Cheah et al. |
| 2021/0343658 | A1 | 11/2021 | Talledo |
| 2021/0343684 | A1 | 11/2021 | Kim et al. |
| 2021/0384135 | A1 | 12/2021 | Kuan et al. |
| 2022/0028829 | A1 | 1/2022 | Cheng et al. |
| 2022/0045004 | A1 | 2/2022 | Hwang et al. |
| 2022/0068821 | A1 | 3/2022 | Cheah et al. |
| 2022/0068833 | A1 | 3/2022 | Lim et al. |
| 2022/0077065 | A1 | 3/2022 | Kuan et al. |
| 2022/0223512 | A1 | 7/2022 | Kuo et al. |
| 2022/0230982 | A1 | 7/2022 | Palm et al. |
| 2022/0344249 | A1 | 10/2022 | Xie et al. |

FOREIGN PATENT DOCUMENTS

| | | | |
|---|---|---|---|
| DE | 102021119280 | A1 | 3/2022 |
| DE | 102021119743 | A1 | 3/2022 |
| DE | 102021120029 | A1 | 3/2022 |
| DE | 102021120182 | A1 | 3/2022 |

OTHER PUBLICATIONS

Song E., et al., "Through-Silicon-Via-Based Decoupling Capacitor Stacked Chip in 3-D-Ics", IEEE Transactions on Components, Packaging and Manufacturing Technology, IEEE, USA, vol. 3, No. 9, Sep. 1, 2013, XP011525889, pp. 1467-1480.

Taiwan Search Report—TW111111200—TIPO—Jul. 30, 2025.

International Search Report and Written Opinion—PCT/US2024/017218—ISA/EPO—Jun. 27, 2024.

* cited by examiner

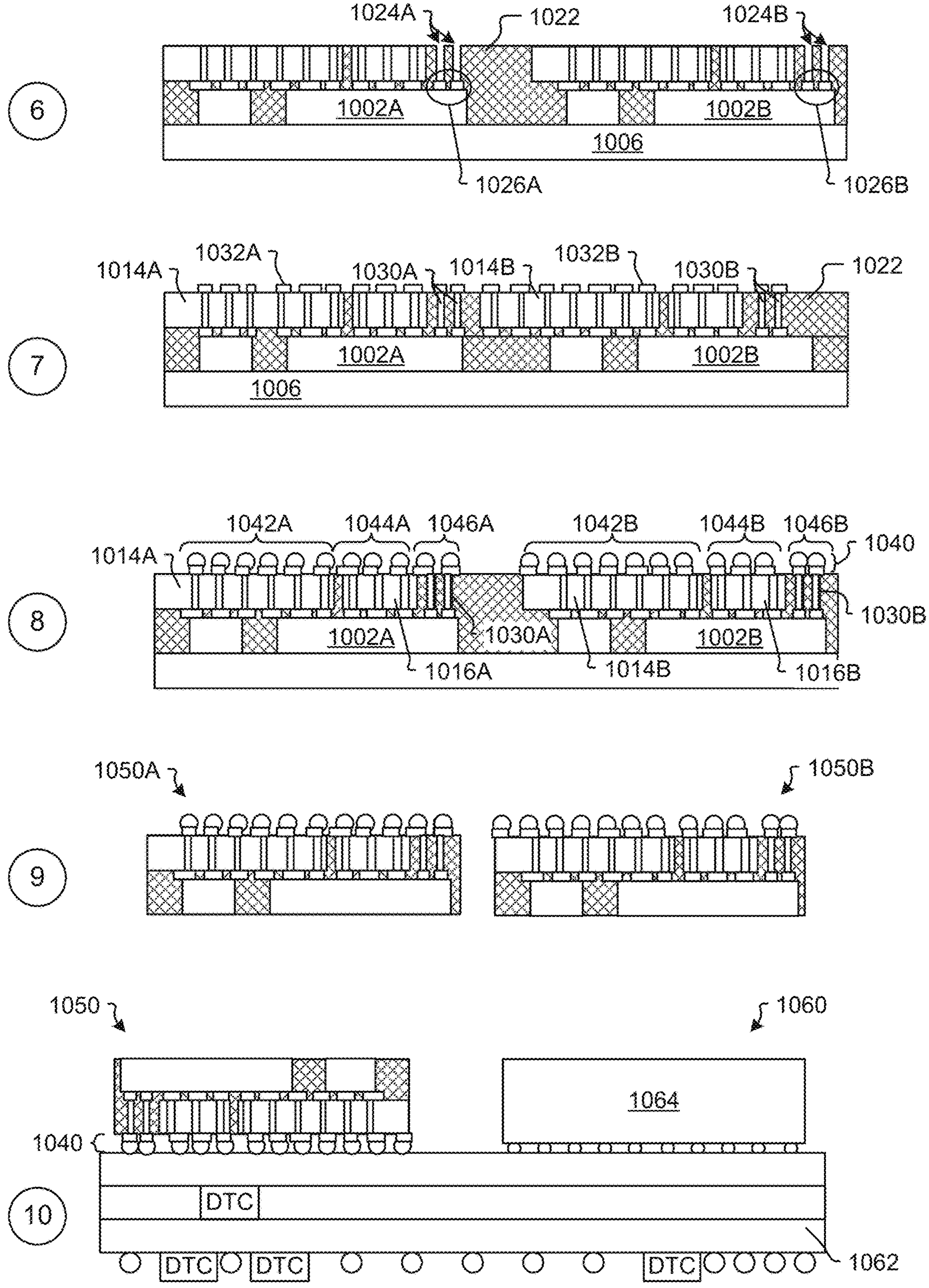
FIG. 10 (End)

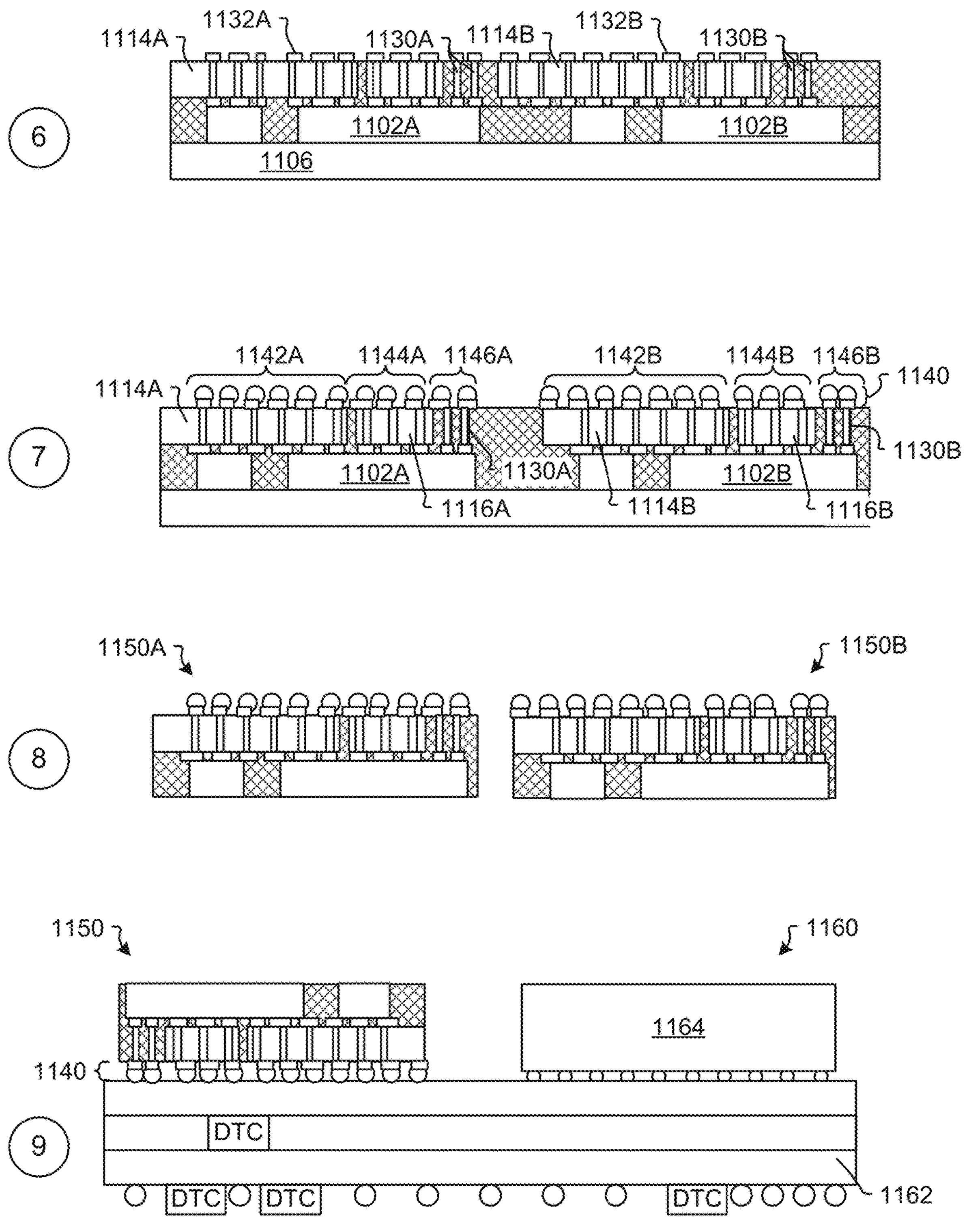
FIG. 11 (End)

STACKED INTEGRATED CIRCUIT DEVICE INCLUDING INTEGRATED CAPACITOR DEVICE

I. CROSS-REFERENCE TO RELATED APPLICATIONS

The present application claims priority from the U.S. Provisional Patent Application No. 63/498,978, filed Apr. 28, 2023, entitled "STACKED INTEGRATED CIRCUIT DEVICE INCLUDING INTEGRATED CAPACITOR DEVICE" the content of which is incorporated herein by reference in its entirety.

II. FIELD

Various features relate to stacked integrated circuit devices.

III. BACKGROUND

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. These mobile applications, however, are susceptible to power and signal routing issues when multiple dies are arranged within the small form factor. In particular, decoupling for a power distribution network (PDN) of a stacked integrated circuit (IC) to suppress power distribution noise is difficult due to a smaller footprint of stacked ICs.

IV. SUMMARY

Various features relate to integrated circuit devices.

One example provides a stacked integrated circuit (IC) device includes a first die including active circuitry and a power distribution network (PDN). The first die has a first set of contacts on a first side of the first die. The stacked IC device also includes a second die coupled, on a first side of the second die, to the first side of the first die. The second die also includes, on a second side of the second die, a second set of contacts to electrically connect circuitry of the second die to a substrate. The stacked IC device also includes an integrated capacitor device (ICD) coupled to the first side of the first die. The ICD is electrically connected, via the first set of contacts, to the PDN and includes one or more through-ICD conductors to electrically connect the PDN to the substrate.

Another example provides a device that includes a stacked IC device. The stacked IC device includes a first die including active circuitry and a PDN. The first die has a first set of contacts on a first side of the first die. The stacked IC device also includes a second die coupled, on a first side of the second die, to the first side of the first die. The second die also includes, on a second side of the second die, a second set of contacts to electrically connect circuitry of the second die to a substrate. The stacked IC device also includes an ICD coupled to the first side of the first die. The ICD is electrically connected, via the first set of contacts, to the PDN and includes one or more through-ICD conductors to electrically connect the PDN to the substrate.

Another example provides a method for fabricating a stacked IC device. The method includes coupling a first side of a second die to a first side of a first die. The first die includes a first set of contacts on the first side of the first die, active circuitry, and a power distribution network PDN. The second die includes, on a second side of the second die, a second set of contacts to electrically connect circuitry of the second die to a substrate. The method also includes coupling, via the first set of contacts, an ICD to the first side of the first die, where the ICD includes one or more through-ICD conductors to electrically connect the PDN to the substrate.

V. BRIEF DESCRIPTION OF THE DRAWINGS

Various features, nature and advantages may become apparent from the detailed description set forth below when taken in conjunction with the drawings in which like reference characters identify correspondingly throughout.

Figure 10:
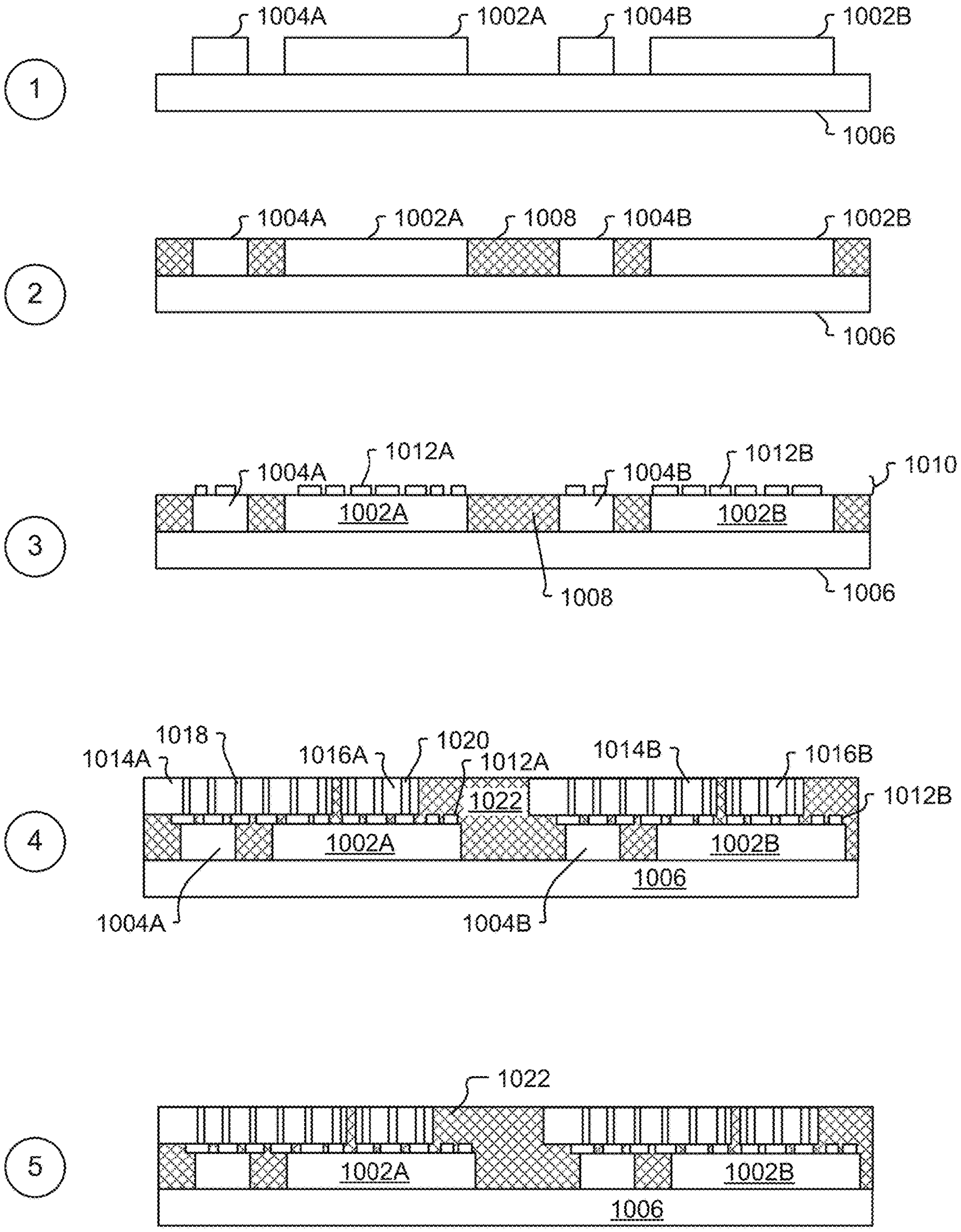

FIG. 10 (which extends across several pages) illustrates an exemplary sequence for fabricating an exemplary stacked IC device.

Figure 11:
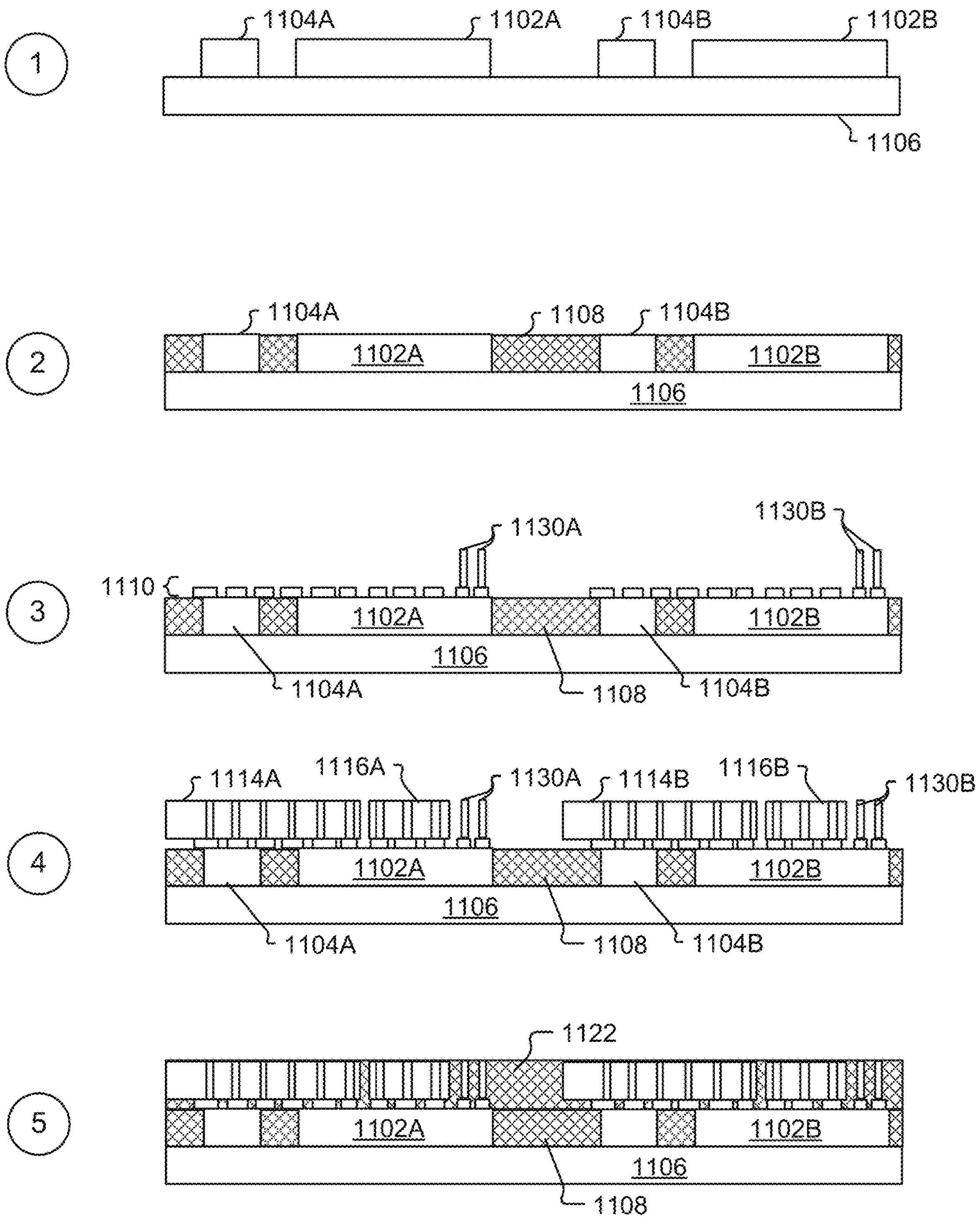

FIG. 11 (which extends across several pages) illustrates another exemplary sequence for fabricating an exemplary stacked IC device.

Figure 12:
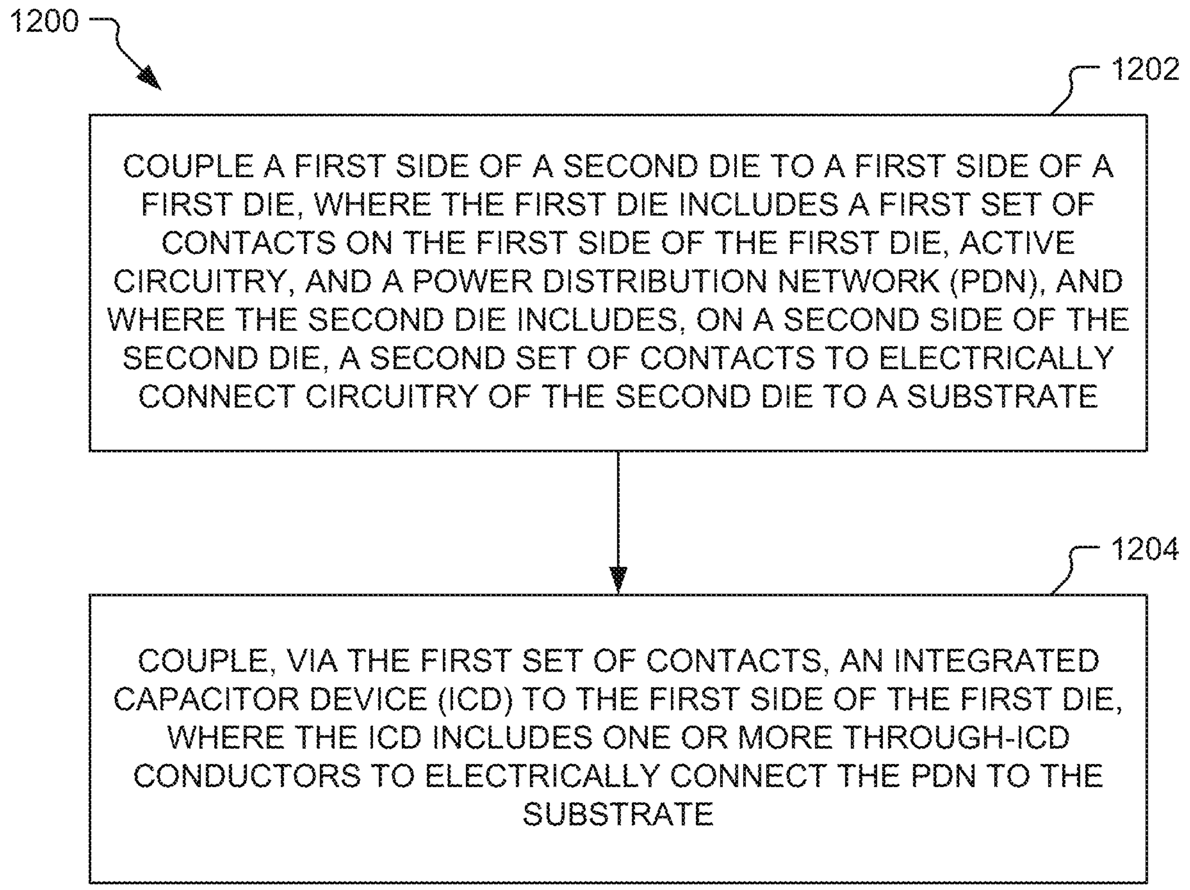

FIG. 12 illustrates an exemplary flow diagram of a method for fabricating an exemplary stacked IC device.

Figure 13:
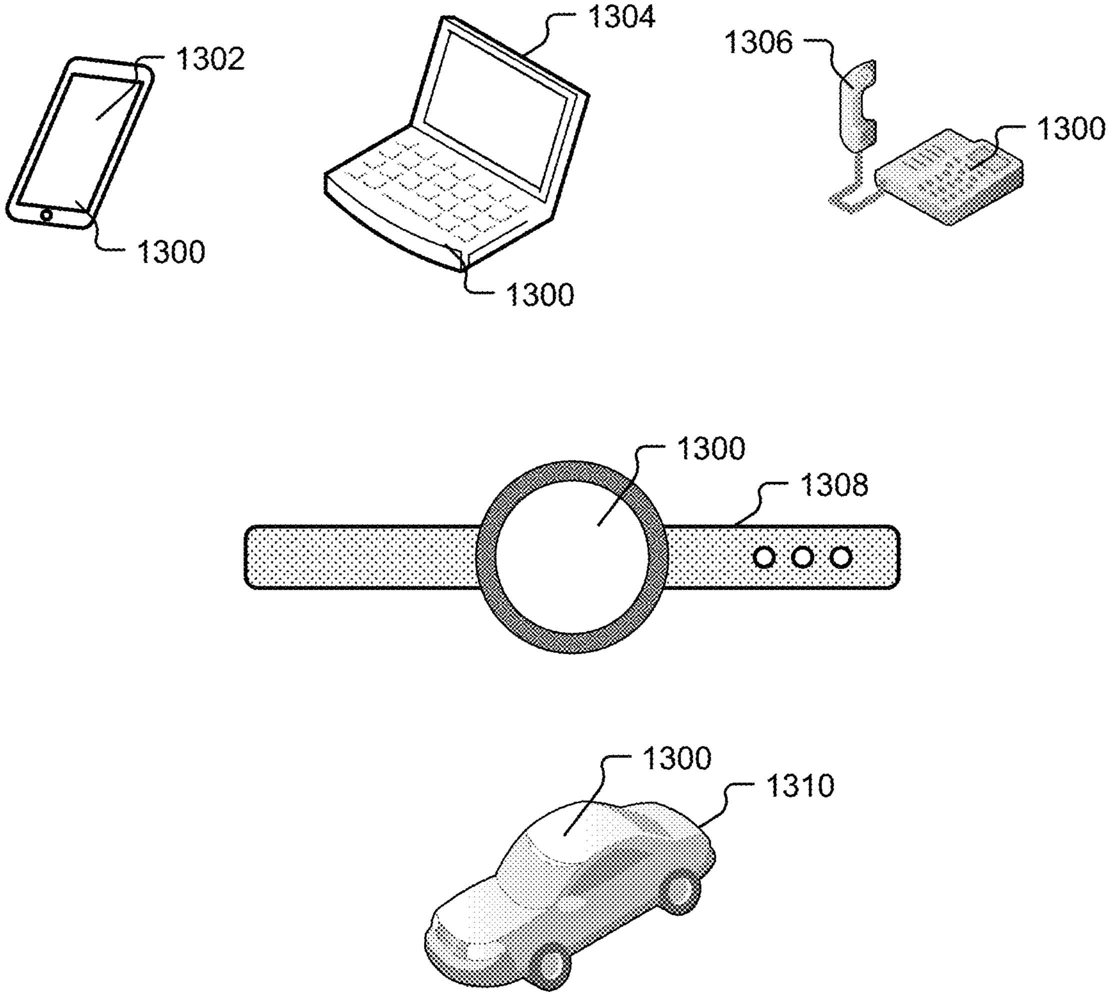

FIG. 13 illustrates various electronic devices that may integrate a die, an electronic circuit, an integrated device, an integrated passive device (IPD), a passive component, a package, and/or a device package described herein.

VI. DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Improvements in manufacturing technology and demand for lower cost and more capable electronic devices has led to increasing complexity of ICs. Often, more complex ICs have more complex interconnection schemes to enable interaction between ICs of a device. The number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

Stacked die schemes and chiplet architectures are becoming more common as significant power performance area (PPA) yield enhancements are demonstrated for stacked die and chiplet architecture product lines. As used herein, "stacked dies" and/or "stacked ICs" refer to arrangements in which one die (e.g., a first die) is disposed over (including directly over) another die (e.g., a second die). In a stacked die or stacked IC device, the one or more of the dies can also be positioned over one or more other devices, such as an integrated capacitor device, as described further below. Unfortunately, stacked die schemes can involve high power density targets, which impose significant power distribution inefficiencies. Various aspects of the present disclosure provide a stacked IC device arranged to provide improved integration of a capacitor with a power distribution network (PDN), resulting in improved PDN performance.

As used herein, the term "layer" includes a film, and is not construed as indicating a vertical or horizontal thickness unless otherwise stated. As used herein, the term "chiplet" may refer to an integrated circuit block, a functional circuit block, or other like circuit block specifically designed to work with one or more other chiplets to form a larger, more complex chiplet architecture.

A 3D integrated circuit (3D IC) includes a set of stacked and interconnected dies. Generally, a 3D IC architecture can achieve higher performance, increased functionality, lower power consumption, and/or smaller footprint, as compared to providing the same circuitry in a monolithic die or in a two-dimensional (2D) IC structure. Unfortunately, capacitive decoupling for power distribution networks (PDNs) of 3D ICs to suppress power distribution noise is challenging. In particular, the available space for landside capacitors (LSCs) under a die shadow in a 3D IC is limited due to the smaller footprint of 3D ICs. For example, different logic blocks of a 3D IC may be placed to overlap each other in the stacked dies, making it even more challenging to provide decoupling for the circuitry in the stacked dies. In addition, an electrical path of the traditional landside capacitor placement on a package substrate may exhibit larger inductance parasitics, which may degrade the landside capacitor decoupling performance.

Aspects of the present disclosure are directed to a stacked IC device that uses a 3D IC architecture, where an integrated capacitor device (ICD) is stacked with the dies in the 3D IC architecture to provide PDN capacitor integration. In some aspects of the present disclosure, a capacitor integration approach disposes the ICD in a space adjacent to a lower die of a die stack (e.g., between an upper die of the die stack and a substrate under the lower die) and electrically coupled to the PDN of the upper die, as described further below. The ICD can include, for example, one or more deep trench capacitors integrated in a semiconductor (e.g., silicon) die, one or more multilayer ceramic capacitors, one or more integrated passive device (IPD) capacitors, etc.

Exemplary Stacked IC Device Including Integrated Capacitor Device

Figure 1A:
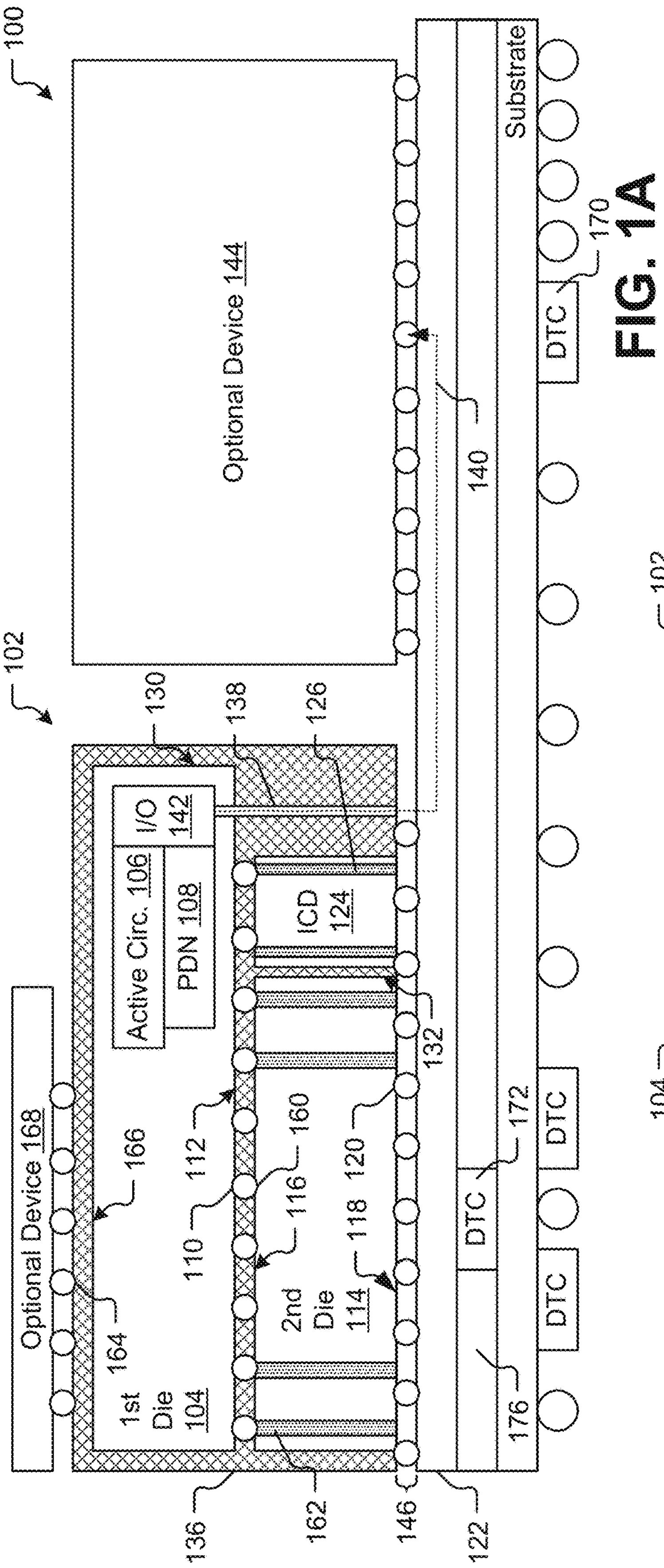
FIG. 1A illustrates a cross sectional profile view of a device that includes an exemplary stacked IC device.
Figure 1B:
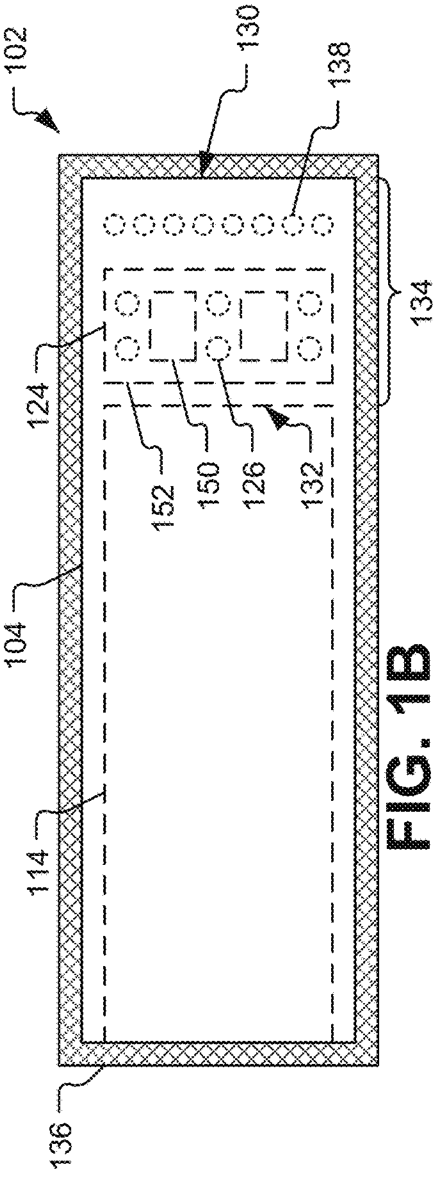
FIG. 1B illustrates a top view of the exemplary stacked IC device of FIG. 1A.

FIG. 1A illustrates a cross sectional profile view of a device 100 that includes an exemplary stacked IC device 102. FIG. 1B illustrates a top view of the exemplary stacked IC device of FIG. 1A. In FIG. 1B (and later top views), a top die (e.g., a first die 104) of a die stack is illustrated with a solid line, and components beneath the top die in the top view are illustrated with dashed lines.

The stacked IC device 102 includes a plurality of dies (e.g., the first die 104 and a second die 114). Each die can include integrated circuitry, such as a plurality of transistors and/or other circuit elements arranged and interconnected to form logic cells, memory cells, etc. Components of the integrated circuitry can be formed in and/or over a semiconductor substrate. Different implementations can use different types of transistors, such as a field effect transistor (FET), planar FET, finFET, a gate all around FET, or mixtures of transistor types. In some implementations, a front end of line (FEOL) process may be used to fabricate the integrated circuitry in and/or over the semiconductor substrate.

In the stacked IC device 102 of FIGS. 1A and 1B, the first die 104 includes active circuitry 106 and a power distribution network (PDN) 108. The PDN 108 includes, for example, one or more power rails, one or more ground rails, etc. The active circuitry 106 includes, for example, processing logic blocks (e.g., transistor blocks), memory blocks, etc. The first die 104 also includes a first set of contacts (including representative contact 110) on a first side 112 of the first die 104.

In the stacked IC device 102 of FIGS. 1A and 1B, the second die 114 is coupled, on a first side 116 of the second die, to the first side 112 of the first die 104. The second die 114 includes, on a second side 118 of the second die 114, a second set of contacts (including representative contact 120) to electrically connect circuitry of the second die 114 to a substrate 122. The circuitry of the second die 114 is not illustrated due to space constraints; however, the circuitry of the second die 114 can include a PDN (e.g., one or more power rails, one or more ground rails), processing logic blocks, memory blocks, or other functional circuit blocks configured to operate in conjunction with the active circuitry 106 of the first die 104.

The stacked IC device 102 also includes an integrated capacitor device (ICD) 124 coupled to the first side 112 of the first die 104. The ICD 124 is electrically connected, via the first set of contacts, to the PDN 108 and includes one or more through-ICD conductors 126 to electrically connect the PDN 108 to the substrate 122. As illustrated in FIG. 1B, the ICD 124 includes one or more capacitors 150 formed on or embedded within a substrate 152. For example, in some implementations, the capacitor(s) 150 include one or more trench capacitors (e.g., deep trench capacitors (DTCs)) in a semiconductor substrate. In this example, the semiconductor substrate can include or correspond to a third die (i.e., a die that is distinct from the first die 104 and the second die 114). In such implementations, the through-ICD conductor(s) 126 include vias through the semiconductor substrate. As another example, the capacitor(s) 150 include or correspond to one or more multilayer ceramic capacitors.

In a particular aspect, at least one edge 130 of the first die 104 overhangs at least one edge 132 of the second die 114 to define an overhang region 134, and the ICD 124 is disposed within the overhang region 134. Disposing the ICD 124 in the overhang region 134 positions the capacitor(s) 150 of the ICD 124 very close to the first die 104 enabling use of very short, low inductance electrical connections between the capacitor(s) 150 and the PDN 108.

In some implementations, the stacked IC device 102 includes mold compound 136 at least partially encapsulating the first die 104, the second die 114, and the ICD 124 to form a packaged IC device. In some such implementations, one or more conductors 138 pass through the mold compound 136 and are electrically connected to the first die 104. In such implementations, the conductor(s) 138 (e.g., through-mold vias (TMVs) are configured to provide an electrical connection between the first die 104 and the substrate 122. For example, in some such implementations, the first die 104 includes input/output (I/O) circuitry 142, and the conductor(s) 138 are connected to the I/O circuitry 142 to provide a data path 140 between the first die 104 and another device 144 that is coupled to the substrate 122. As one illustrative example, the other device 144 can include a Dynamic Random-Access Memory (DRAM) chip (or chiplet). In this illustrative example, the I/O circuitry 142 of the first die 104 can include or correspond to interface circuitry (e.g., serializer/deserializer (SerDes) circuitry, a double data rate (DDR)-type DRAM bus interface circuit), memory buffers, and/or other circuitry that facilitates interaction between the active circuitry 106 and the DRAM. In some implementations, the I/O circuitry 142 can be connected to other devices in addition to or instead of the other device 144. For example, the I/O circuitry 142 can interact with one or more other devices on a printed circuit board via connectors 174.

The stacked IC device 102 can also include connectors to couple the stacked IC device 102 to other circuitry of the device 100. For example, the stacked IC device 102 can include interconnects 146, such as ball grid array (BGA), C4 bumps, or other connectors to electrically couple the stacked IC device 102 to the substrate 122. In this example, the interconnects 146 can include connectors to the second set of contacts of the second die 114, the through-ICD conductor(s) 126, and the one or more conductors 138 to the substrate 122.

In FIG. 1A, the stacked IC device 102 includes a third set of contacts (including representative contact 160) on the first side 116 of the second die 114. The third set of contacts electrically connect various circuitry of the first and second dies 104, 114, such as connecting the active circuitry 106 of the first die 104 to the circuitry of the second die 114. The third set of contacts on the first side 116 of the second die 114 can include, for example, microbumps, conductive pillars, conductive pads (e.g., for pad to pad bonding), or other similar chiplet-to-chiplet interconnect contacts used for three-dimensional (3D) chiplet stacking. For example, in some implementations, the first die 104 is a first chiplet and the second die 114 is a second chiplet designed to operate in conjunction with the first chiplet. To illustrate, in some implementations, the active circuitry 106 of the first chiplet/first die 104 includes one or more first functional circuit blocks and the circuitry of the second chiplet/second die 114 includes one or more second functional circuit blocks, where the one or more first functional circuit blocks and the one or more second functional circuit blocks are operationally dependent upon one another.

Forming the stacked IC device 102 using chiplets arranged and interconnected as a 3D stacked IC can provide various benefits as compared to providing the same functional circuitry in one monolithic chip. For example, each chiplet is smaller than a single monolithic die including all of the same functional circuit blocks would be. Since yield loss (and costs due to yield lost) in IC manufacturing tends to increase as the die size increases, using smaller dies can reduce yield loss (i.e., increase yield) of the IC manufacturing process. Another benefit is that the chiplets can be fabricated in different locations and/or by different manufacturers, and in some cases, using different fabrication technologies (e.g., different fabrication technology nodes). As an example, one die of a chiplet-based integrated device (e.g., the first die 104 of the stacked IC device 102) can include components (e.g., interconnects, transistors, etc.) that have a first minimum size, and another die of the chiplet-based integrated device (e.g., the second die 114 of the stacked IC device 102) can include components (e.g., interconnects, transistors, etc.) that have a second minimum size, where the second minimum size is greater than the first minimum size. In contrast, all of the circuitry of a monolithic die is fabricated using the same fabrication technologies and equipment. As a result, when manufacturing a monolithic die, the entire die may be subject to the tightest manufacturing constraint of the most complex component of the monolithic die. In contrast, when using chiplets, different chiplets can be manufactured using different fabrication technologies (e.g., different fabrication technology nodes), and only the chiplet or chiplets that include the most complex components are subjected to the tightest manufacturing constraints. In this arrangement, chiplets fabricated using less expensive and/or higher yield fabrication technologies can be integrated with chiplets fabricated using more expensive and/or lower yield fabrication technologies to form an IC (e.g., the stacked IC device 102), resulting in overall savings. Still further, in some cases, as technology improves, the design of a chiplet can be changed. Chiplet stacking allows such new chiplet designs to be integrated with older chiplet designs to form stacked IC devices, which improves manufacturing flexibility and reduces design costs.

Optionally, the second die 114 can include one or more through silicon vias (TSVs) 162 coupling one or more contacts of the third set of contacts (e.g., the contact 160) to one or more contacts of the second set of contacts (e.g., the contact 120) to electrically connect the active circuitry 106 of the first die 104 to the substrate 122. In some implementations, the stacked IC device 102 includes a fourth set of contacts (including representative contact 164) on a second side 166 of the first die 104 to electrically connect the stacked IC device 102 to another device (e.g., optional device 168 in FIG. 1A). The optional device 168 can include another chiplet of the stacked IC device 102. Alternatively, the optional device 168 can include a distinct IC coupled to the stacked IC device 102 (e.g., a distinct monolithic die or stacked IC device that provides different functionality than the stacked IC device 102). When the optional device 168 is included, the first die 104 can include TSVs similar to the TSVs 162 of the second die 114 enabling interconnection from the optional device 168 to the second die 114 and/or from the optional device 168 through the stacked IC device 102 to the substrate 122.

In a particular aspect, the capacitor(s) 150 are coupled to the PDN 108 to suppress power distribution noise of the PDN 108. In conventional implementations, the PDN 108 can be coupled to one or more landside capacitors (such as a DTC 170 in FIG. 1A) to one or more embedded capacitors (such as a DTC 172 in FIG. 1A), or both, to provide power distribution noise suppression. While one benefit of using stacked IC devices (such as the stacked IC device 102) is reduced footprint of such devices as compared to comparable monolithic IC devices, this reduced footprint can give rise to challenges with positioning of noise suppression capacitors. For example, noise suppression capacitors should be positioned as close to a PDN as possible to provide a low inductance electrical connection between the noise suppression capacitors and the PDN. Higher inductance leads to inefficient use of capacitors leading to degraded PDN performance, and thus, lower inductance electrical connections are generally preferred, especially in low-power devices (e.g., mobile communication devices or other battery powered devices).

One strategy that is used to position noise suppression capacitors near the PDN is to position the noise suppression capacitors in the die shadow of the die or IC device that includes the PDN. Stacked IC devices (such as the stacked IC device 102) have small die shadows, and often area in the die shadow could be beneficially used for other purposes, such as to provide electrical connectors 174. Thus, a technical benefit of positioning the ICD 124 in an overhang region 134 between the first die 104 and the substrate 122 is that fewer landside capacitors can be used for noise suppression, which frees up space on the substrate 122 for more electrical connectors 174 or for more beneficial positioning of such electrical connectors 174.

Another strategy that is used to limit impedance of noise suppression capacitors to a PDN of an IC device is to embed one or more noise suppression capacitors within the substrate 122. The DTC 172 is an example of such a noise suppression capacitor. Positioning the noise suppression capacitors in the substrate 122 faces the same challenges regarding the smaller size of the die shadow, but can reduce displacement of connectors 174 of the substrate 122. However, positioning noise suppression capacitors in the substrate 122 increases manufacturing complexity of the substrate 122 and can require forming discontinuities in one or more conductive planes 176 of the substrate 122, which can decrease performance of the device 100. Thus, a technical benefit of positioning the ICD 124 in an overhang region 134 between the first die 104 and the substrate 122 is that manufacturing complexity of the substrate 122 is not increased, and discontinuities in the conductive plane(s) 176 of the substrate 122 can be avoided.

In addition to the above, a technical benefit of positioning the ICD 124 in an overhang region 134 between the first die 104 and the substrate 122 is that this arrangement provides a much shorter (and therefore lower impedance) conductive path between the PDN 108 and the capacitors 150 than is used to connect a PDN to either a capacitor embedded in the substrate 122 or a landside capacitor, leading to improved performance (e.g., better noise suppression) of the PDN.

Although FIGS. 1A and 1B illustrate the stacked IC device 102 as including two dies (e.g., the first die 104 and the second die 114) in some implementations, the stacked IC device 102 includes more than two dies stacked and interconnected to form a 3D IC stack. In such implementations, one or more additional overhang regions 134 can be formed between dies of the stacked IC device 102, and one or more additional ICDs 124 or other devices can be disposed in such overhang regions 134 and electrically connected to a top die of the overhang region 134.

Figure 2A:
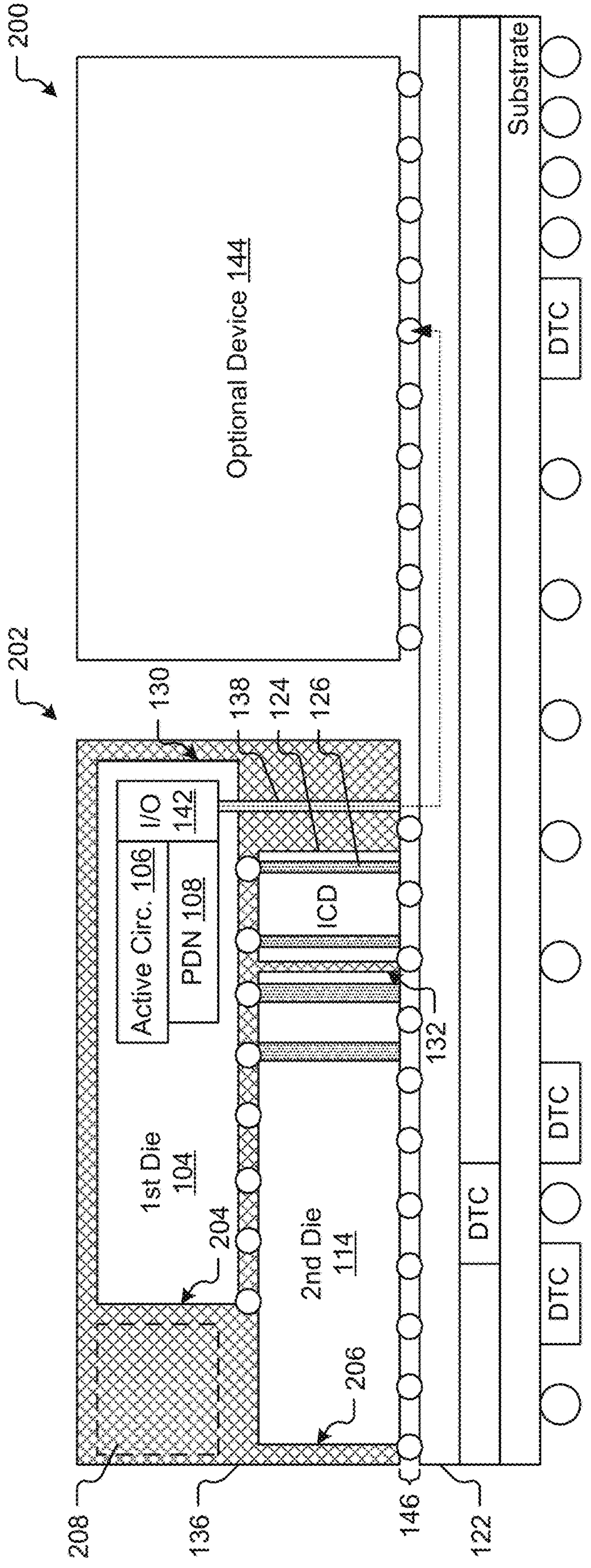
FIG. 2A illustrates a cross sectional profile view of a device that includes an exemplary stacked IC device.
Figure 2B:
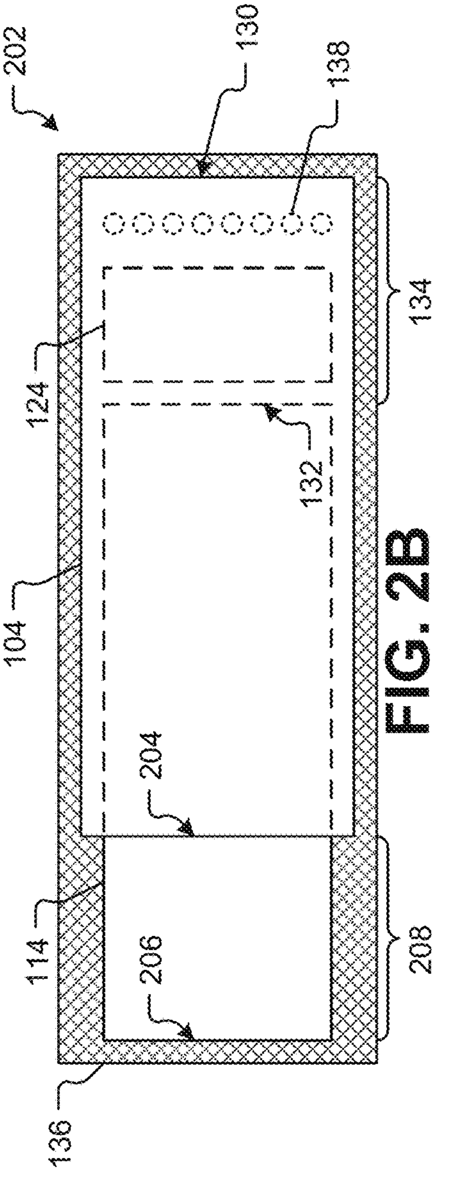
FIG. 2B illustrates a top view of the exemplary stacked IC device of FIG. 2A.

FIG. 2A illustrates a cross sectional profile view of a device 200 that includes an exemplary stacked IC device 202, and FIG. 2B illustrates a top view of the exemplary stacked IC device 202 of FIG. 2A. The device 200 of FIG. 2A includes many of the same components and features as are described above with reference to FIGS. 1A and 1B. Such components and features are physically and operationally the same as described above with reference to FIGS. 1A and 1B and are labeled in FIGS. 2A and 2B using the same reference numbers. In some implementations, the device 200 includes all of the same features and components as the device 100 of FIGS. 1A and 1B; however, some components and features illustrated in FIGS. 1A and 1B have been omitted from (or are not labeled with reference numbers in) FIGS. 2A and 2B for simplicity of illustration and to highlight differences between the device 100 and the device 200. Omission of such features and reference numbers should not be understood as limiting the features and components of FIGS. 2A and 2B to only those specifically called out below. For example, while FIG. 2A does not show the optional device 168 of FIG. 1A, the device 200 can include the optional device 168. Furthermore, FIG. 2A still includes for example, the stacked IC device 202 which can include interconnects 146 (see FIG. 1A), such as ball grid array (BGA), C4 bumps, or other connectors to electrically couple the stacked IC device 102 to the substrate 122. The interconnects 146 can include connectors to the second set of contacts of the second die 114, through-ICD conductor(s) 126, and the one or more conductors 138 to the substrate 122.

In the example illustrated in FIGS. 1A and 1B, the first die 104 is larger than the second die 114 allowing the edge 130 of the first die 104 to extend past the edge 132 of the second die 114 to form the overhang region 134. In the example illustrated in FIGS. 2A and 2B, the sizes of the first die 104 and the second die 114 are illustrated as having sizes that are more similar (or are identical) for the purpose of highlighting offset positioning of the dies 104 and 114. To illustrate, in this example, the first die 104 is positioned off center with respect to the second die 114 to form the overhang region 134. For example, a second edge 206 of the second die 114 extends past a second edge 204 of the first die 104 to define an underhang region 208. In the example illustrated in FIGS. 2A and 2B, the underhang region 208 can be left empty or filled with the mold compound 136 or a spacer. Note that the relative sizes of the dies 104 and 114 illustrated in FIGS. 2A and 2B is merely one example. In other examples, the dies 104, 114 can be of significantly differing sizes and can be stacked in an offset arrangement, as illustrated in FIGS. 2A and 2B, to form one or more overhang regions (e.g., the overhang region 134) and one or more underhang regions (e.g., the underhang region 208) without departing from the scope of the disclosure.

Figure 3A:
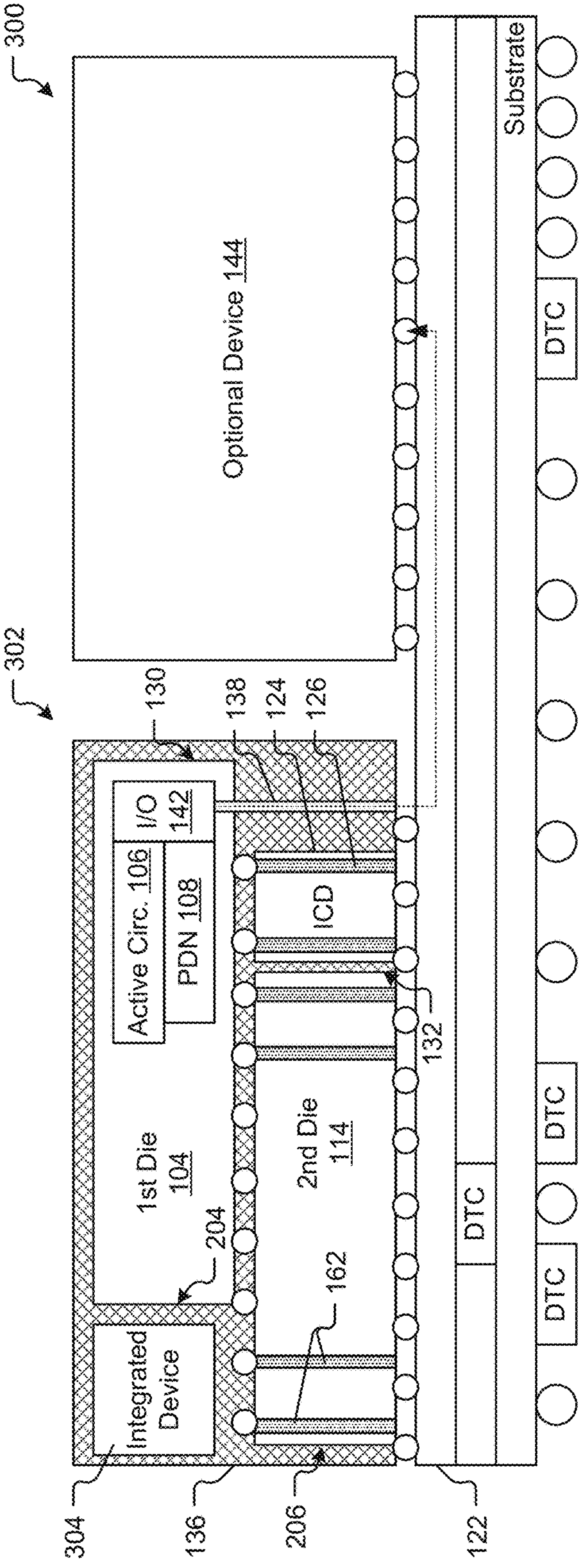
FIG. 3A illustrates a cross sectional profile view of a device that includes an exemplary stacked IC device.
Figure 3B:
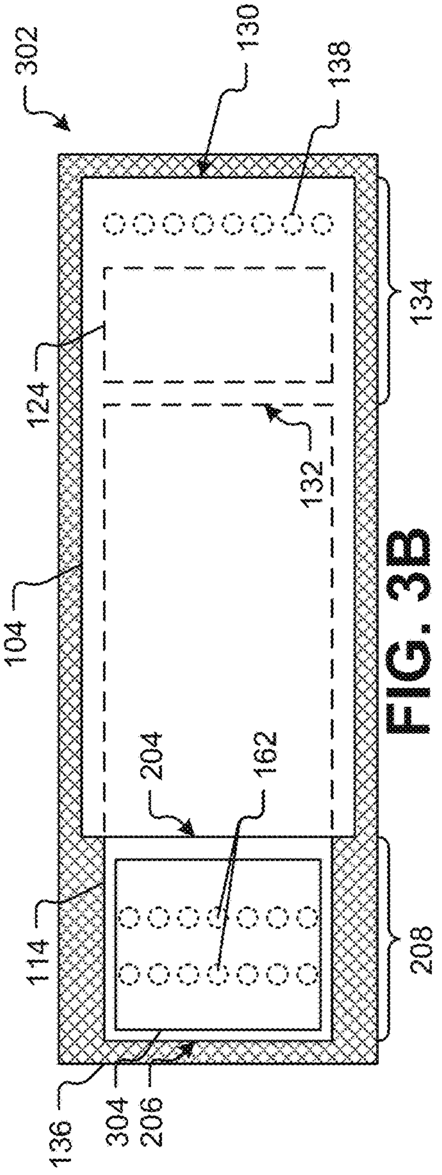
FIG. 3B illustrates a top view of the exemplary stacked IC device of FIG. 3A.

FIG. 3A illustrates a cross sectional profile view of a device 300 that includes an exemplary stacked IC device 302, and FIG. 3B illustrates a top view of the exemplary stacked IC device 302 of FIG. 3A. The device 300 includes many of the same components and features as are described above with reference to FIGS. 1A to 2B. Such components and features are physically and operationally the same as described above and are labeled using the same reference numbers. In some implementations, the device 300 includes all of the same features and components as the device 100 of FIGS. 1A and 1B and/or the device 200 of FIGS. 2A and 2B; however, some such components and features have been omitted from (or are not labeled with reference numbers in) FIGS. 3A and 3B for simplicity of illustration and to highlight differences between the devices 100, 200, and 300. Omission of such features and reference numbers should not be understood as limiting the features and components of FIGS. 3A and 3B to only those specifically called out below. For example, while FIG. 3A does not show the optional device 168 of FIG. 1A, the device 300 can include the optional device 168. For example, the stacked IC device 302 can include interconnects 146 (e.g., see FIG. 1A), such as ball grid array (BGA), C4 bumps, or other connectors to electrically couple the stacked IC device 302 to the substrate 122. In this example, the interconnects 146 can include connectors to the second set of contacts of the second die 114, the through-ICD conductor(s) 126, and the one or more conductors 138 to the substrate 122.

In the example illustrated in FIGS. 2A and 2B, the second edge 206 of the second die 114 extends past the second edge 204 of the first die 104 to define the underhang region 208, which is left empty or filled with a spacer. In the example illustrated in FIGS. 3A and 3B, an integrated device 304 is disposed in the underhang region 208. In some implementations, the integrated device 304 includes an ICD similar to the ICD 124. In some such implementations, the integrated device 304 includes through-ICD conductors (similar to the through-ICD conductor(s) 126 of the ICD 124) to connect the stacked IC device 302 to another device (e.g., the optional device 168 of FIG. 1A) disposed above the first die 104. Alternatively, if no device is disposed above the first die 104, through-ICD conductor(s) can be omitted from the integrated device 304.

In other implementations, the integrated device 304 includes another die, an integrated passive device, or another component of the stacked IC device 302. Whether the integrated device 304 is an ICD or another device, one or more of the TSVs 162 of the second die 114 can be coupled to the integrated device 304 to electrically connect the integrated device 304 to the substrate 122. Additionally, or alternatively, the integrated device 304 can be electrically connected to circuitry of the second die 114.

Figure 4A:
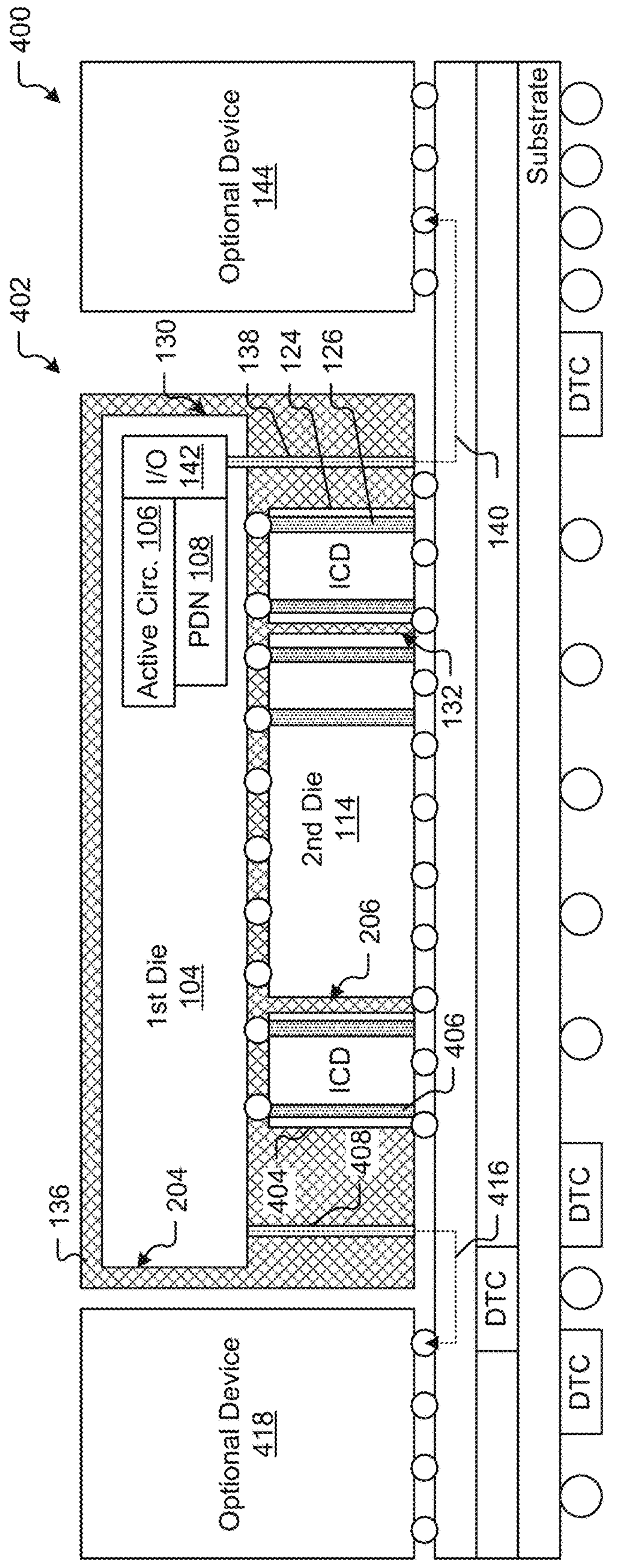
FIG. 4A illustrates a cross sectional profile view of a device that includes an exemplary stacked IC device.
Figure 4B:
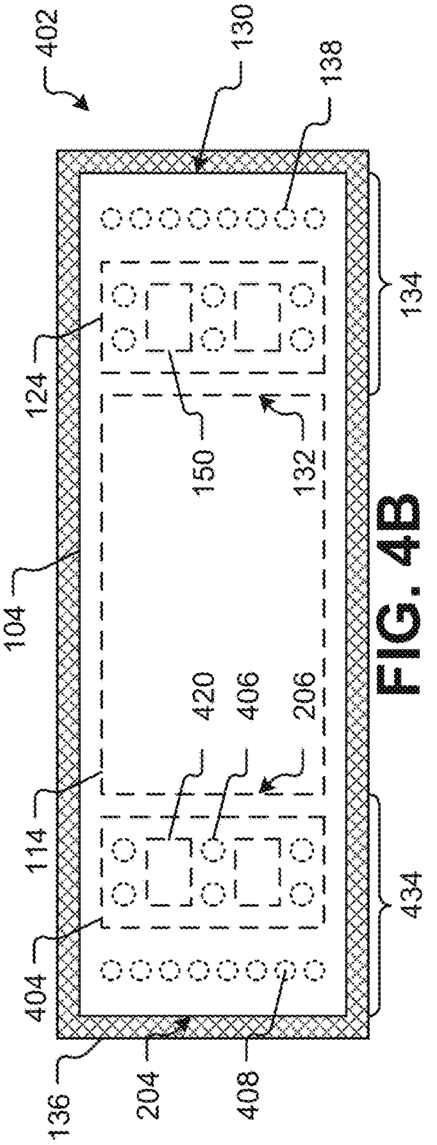
FIG. 4B illustrates a top view of the exemplary stacked IC device of FIG. 4A.

FIG. 4A illustrates a cross sectional profile view of a device 400 that includes an exemplary stacked IC device 402, and FIG. 4B illustrates a top view of the exemplary stacked IC device 402 of FIG. 4A. The device 400 includes many of the same components and features as are described above with reference to FIGS. 1A to 3B. Such components and features are physically and operationally the same as described above and are labeled using the same reference numbers. In some implementations, the device 400 includes all of the same features and components as the device 100 of FIG. 1A; however, some such components and features have been omitted from (or are not labeled with reference numbers in) FIGS. 4A and 4B for simplicity of illustration and to highlight differences between the devices 100, 200, 300, and 400. Omission of such features and reference numbers should not be understood as limiting the features and components of FIGS. 4A and 4B to only those specifically called out below. For example, while FIG. 4A does not show the optional device 168 of FIG. 1A, the device 400 can include the optional device 168. For example, the stacked IC device 402 can include interconnects 146 (e.g., see FIG. 1A), such as ball grid array (BGA), C4 bumps, or other connectors to electrically couple the stacked IC device 402 to the substrate 122. In this example, the interconnects 146 can include connectors to the second set of contacts of the second die 114, the through-ICD conductor(s) 126, and the one or more conductors 138 to the substrate 122. The optional device 418 and/or 144 may also include interconnects 146 (e.g., see FIG. 1A) to contact the optional device 418 and/or 144 to the substrate 122.

In the example illustrated in FIGS. 4A and 4B, the first edge 130 of the first die 104 extends past the first edge 132 of the second die 114 to form the overhang region 134, and the ICD 124 is disposed within the overhang region 134, as described with reference to FIGS. 1A and 1B. Additionally, in the example illustrated in FIGS. 4A and 4B, the second edge 204 of the first die 104 extends past the second edge 206 of the second die 114 to form a second overhang region 434.

In FIGS. 4A and 4B, a second ICD 404 is disposed in the second overhang region 434. The second ICD 404 is similar to the ICD 124. For example, the second ICD 404 can include one or more capacitors 420 and one or more through-ICD conductors 406. In a particular implementation, the capacitor(s) 420 of the ICD 404 are electrically connected to the PDN 108 of the first die 104. In some such implementations, the through-ICD conductor(s) 406 electrically connect the PDN 108 to the substrate 122.

In some implementations, the second overhang region 434 includes the mold compound 136, and one or more conductors 408 pass through the mold compound 136 and are electrically connected to the first die 104. For example, the conductor(s) 408 can provide an electrical connection between the first die 104 and the substrate 122. In some such implementations, the conductor(s) 408 are connected to the I/O circuitry 142 (or another set of I/O circuitry of the first die 104) to provide a data path 416 between the first die 104 and the device 144 or another device 418 coupled to the substrate 122.

Figure 5:
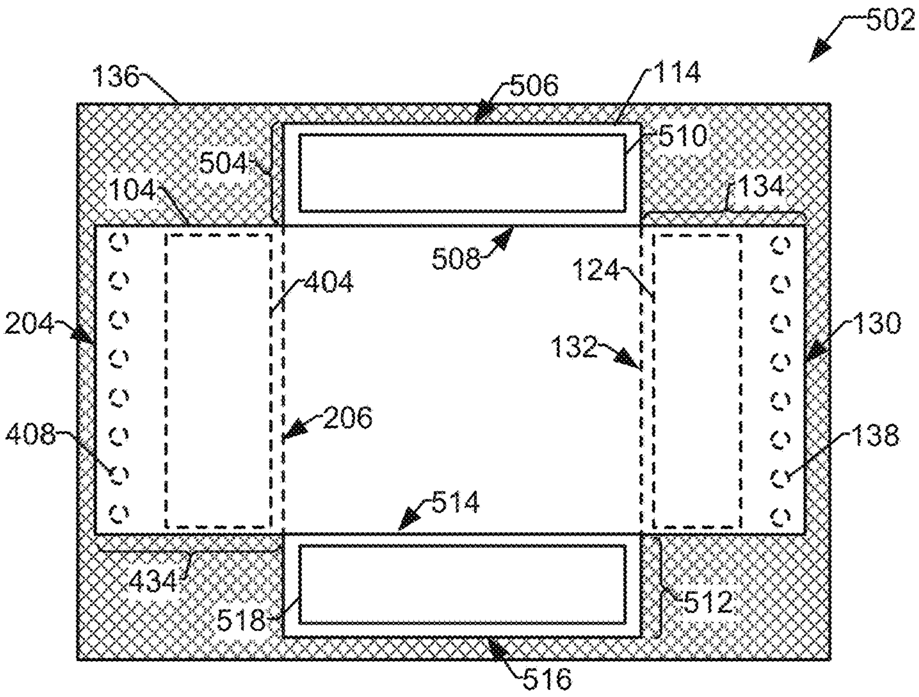
FIG. 5 illustrates a top view of an exemplary stacked IC device.

FIG. 5 illustrates a top view of an exemplary stacked IC device 502 that can be included in or coupled to any of the devices 100, 200, 300, and 400 of FIGS. 1A-4B. The stacked IC device 502 includes many of the same components and features as are described above with reference to FIGS. 1A-4B. Such components and features are physically and operationally the same as described above and are labeled using the same reference numbers. In some implementations, the stacked IC device 502 includes all of the same features and components as the stacked IC device 402 of FIGS. 4A and 4B; however, some such components and features have been omitted from (or are not labeled with reference numbers in) FIG. 5 for simplicity of illustration and to highlight differences between the stacked IC devices 102, 202, 302, 402, and 502. Omission of such features and reference numbers should not be understood as limiting the features and components of FIG. 5 to only those specifically called out below.

The stacked IC device 502 is similar to the stacked IC device 402 in that the first edge 130 of the first die 104 extends past the first edge 132 of the second die 114 to form the overhang region 134, and the second edge 204 of the first die 104 extends past the second edge 206 of the second die 114 to form the second overhang region 434. In the example illustrated in FIG. 5, the ICD 124 and the conductor(s) 138 are disposed within the first overhang region 134, and the ICD 404 and the conductor(s) 408 are disposed within the second overhang region 434.

In contrast to the stacked IC device 402, the stacked IC device 502 includes one or more underhang regions. For example, in FIG. 5, a third edge 506 of the second die 114 extends past a third edge 508 of the first die 104 to define a first underhang region 504. Optionally, as illustrated in FIG. 5, a fourth edge 516 of the second die 114 can extend past a fourth edge 514 of the first die 104 to define a second underhang region 512. While two underhang regions 504, 512 are illustrated, in some implementations, the stacked IC device 502 can include a single underhang region.

In the example illustrated in FIG. 5, one or both of the underhang regions 504, 512 can be filled with mold compound 136 or with a spacer, as described with reference to the underhang region 208 of FIGS. 2A and 2B. Alternatively, in some implementations one or more devices or components of the stacked IC device 502 can be disposed in one or both of the underhang regions 504. For example, in FIG. 5, a device 510 is disposed in the first underhang region 504, and a device 518 is disposed in the second underhang region 512.

In some implementations, the device 510, the device 518, or both, include an ICD, another die, an integrated passive device, or another component of the stacked IC device 302, as described with reference to the integrated device 304 of FIG. 3. In some implementations, one or more of the TSVs 162 of the second die 114 can be coupled to the device 510, one or more of the TSVs 162 of the second die 114 can be coupled to the device 518, or both. Additionally, or alternatively, one or both of devices 510, 518 can be electrically connected to circuitry of the second die 114.

Figure 6:
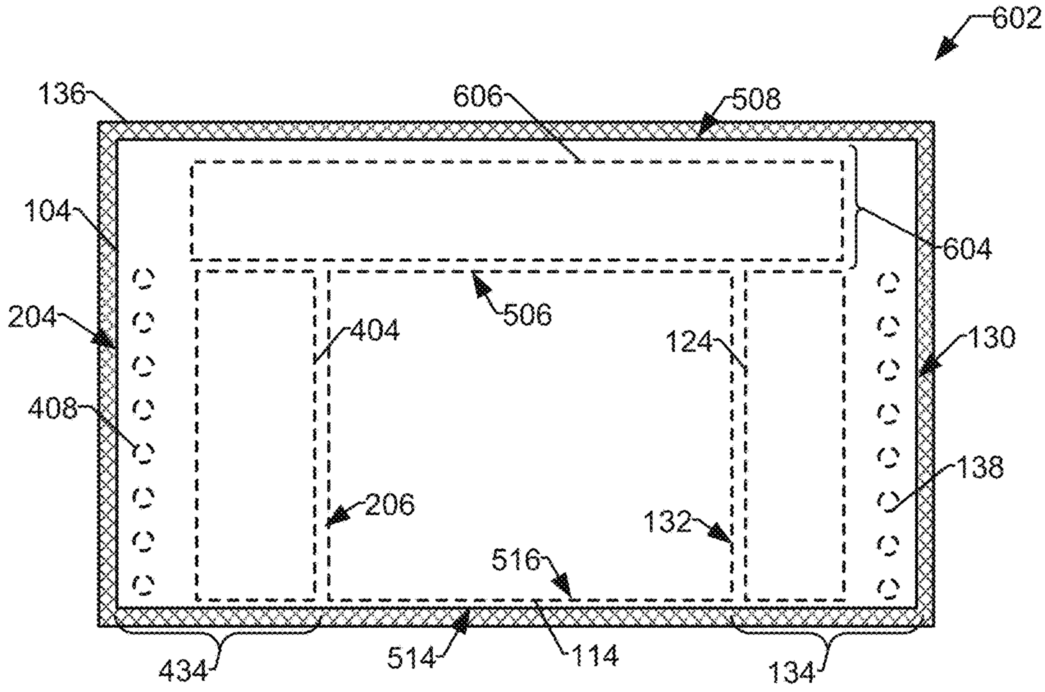
FIG. 6 illustrates a top view of an exemplary stacked IC device.

FIG. 6 illustrates a top view of an exemplary stacked IC device 602 that can be included in or coupled to any of the devices 100, 200, 300, and 400 of FIGS. 1A-4B. The stacked IC device 602 includes many of the same components and features as are described above with reference to FIGS. 1A-4B. Such components and features are physically and operationally the same as described above and are labeled using the same reference numbers. In some implementations, the stacked IC device 602 includes all of the same features and components as the stacked IC device 402 of FIGS. 4A and 4B; however, some such components and features have been omitted from (or are not labeled with reference numbers in) FIG. 6 for simplicity of illustration and to highlight differences between the stacked IC devices 102, 202, 302, 402, 502, and 602. Omission of such features and reference numbers should not be understood as limiting the features and components of FIG. 6 to only those specifically called out below.

The stacked IC device 602 is similar to the stacked IC device 402 in that the first edge 130 of the first die 104 extends past the first edge 132 of the second die 114 to form the overhang region 134, and the second edge 204 of the first die 104 extends past the second edge 206 of the second die 114 to form the second overhang region 434. In the example illustrated in FIG. 6, the ICD 124 and the conductor(s) 138 are disposed within the first overhang region 134, and the ICD 404 and the conductor(s) 408 are disposed within the second overhang region 434.

In contrast to the stacked IC device 402, the stacked IC device 602 includes a third overhang region 604. For example, in FIG. 6, the third edge 508 of the first die 104 extends past the third edge 506 of the second die 114 to define the third overhang region 604.

In the example illustrated in FIG. 6, a device 606 can be disposed in the third overhang region 604. For example, the device 606 can include one or more additional ICDs, one or more additional die, one or more integrated passive devices, or combinations thereof. In some implementations, the third overhang region 434 includes the mold compound 136 (in addition to or instead of the device 606), and one or more conductors pass through the mold compound 136 and are electrically connected to the first die 104.

Optionally, in some implementations, the fourth edge 514 of the first die 104 can also extend past the fourth edge 516 of the second die 114 to define a fourth overhang region. In such implementations, the fourth overhang region can include one or more additional devices similar to the device 606, one or more conductors passing through the mold compound 136 and electrically connected to the first die 104, or combinations thereof.

Figure 7:
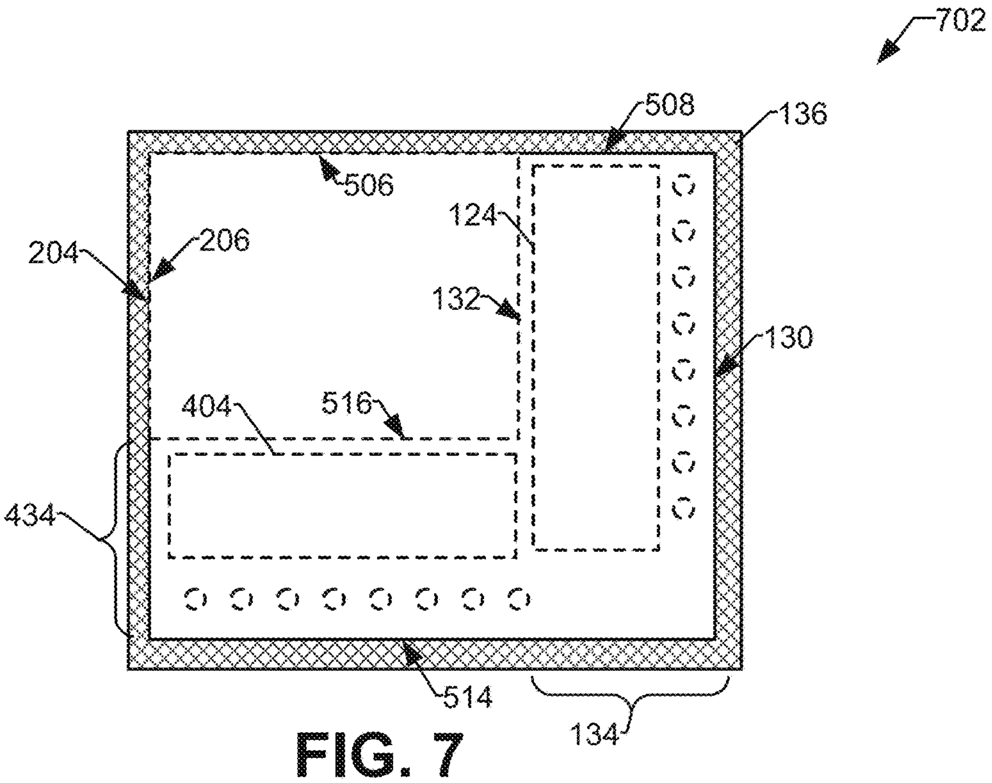
FIG. 7 illustrates a top view of an exemplary stacked IC device.

FIG. 7 illustrates a top view of an exemplary stacked IC device 702 that can be included in or coupled to any of the devices 100, 200, 300, and 400 of FIGS. 1A-4B. The stacked IC device 702 includes many of the same components and features as are described above with reference to FIGS. 1A-4B. Such components and features are physically and operationally the same as described above and are labeled using the same reference numbers. In some implementations, the stacked IC device 702 includes all of the same features and components as the stacked IC device 402 of FIGS. 4A and 4B; however, some such components and features have been omitted from (or are not labeled with reference numbers in) FIG. 7 for simplicity of illustration and to highlight differences between the stacked IC devices 102, 202, 302, 402, 502, 602, and 702. Omission of such features and reference numbers should not be understood as limiting the features and components of FIG. 7 to only those specifically called out below.

Like the stacked IC device 402 of FIGS. 4A and 4B, the first die 104 and the second die 114 of the stacked IC device 702 of FIG. 7 are positioned to define two overhang regions (including the first overhang region 134 and the second overhang region 434). In the stacked IC device 402, the first overhang region 134 is positioned on the opposite side of the second die 114 from the second overhang region 434. In contrast, in FIG. 7, the first overhang region 134 is positioned on a side of the second die 114 that is adjacent to the second overhang region 434. Whether the arrangement of the stacked IC device 402 or the arrangement of the stacked IC device 702 is preferred may depend on, for example, locations of circuitry of the first die 104, locations of other devices that interact with the stacked IC device, as well as other factors. As one example, in the implementation illustrated in FIG. 4A, the device 400 includes a device 144 on one side of the stacked IC device 402, and another device 418 on the opposite side of the stacked IC device 402. In this arrangement, if circuitry of the first die 104 allows connections to the PDN 108, the active circuitry 106, and/or the I/O circuitry 142 from the opposite sides of the first die 104, the stacked IC device 402 may be preferable to the stacked IC device 702. However, in some implementations, circuitry of the first die 104 may be arranged such that connections to other devices (e.g., the device 144 and/or the device 418) are more conveniently disposed along adjacent sides of the first die 104, in which case the stacked IC device 702 may be preferred. Similar considerations apply to convenience of connection to the PDN of the first die 104.

Figure 8:
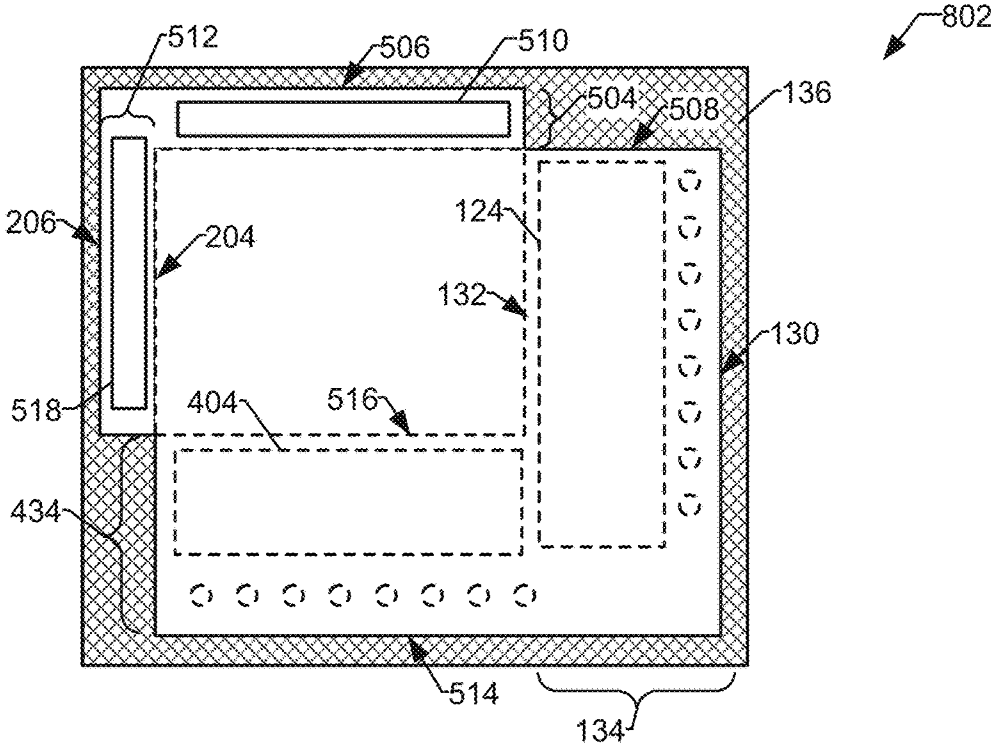
FIG. 8 illustrates a top view of an exemplary stacked IC device.

FIG. 8 illustrates a top view of an exemplary stacked IC device 802 that can be included in or coupled to any of the devices 100, 200, 300, and 400 of FIGS. 1A-4B. The stacked IC device 802 includes many of the same components and features as are described above with reference to FIGS. 1A-4B. Such components and features are physically and operationally the same as described above and are labeled using the same reference numbers. In some implementations, the stacked IC device 802 includes all of the same features and components as the stacked IC device 402 of FIGS. 4A and 4B; however, some such components and features have been omitted from (or are not labeled with reference numbers in) FIG. 8 for simplicity of illustration and to highlight differences between the stacked IC devices 102, 202, 302, 402, 502, 602, 702, and 802. Omission of such features and reference numbers should not be understood as limiting the features and components of FIG. 8 to only those specifically called out below.

Like the stacked IC device 502 of FIG. 5, the first die 104 and the second die 114 of the stacked IC device 802 of FIG. 8 are positioned to define two overhang regions (including the first overhang region 134 and the second overhang region 434) and two underhang regions (including the first underhang region 504 and the second underhang region 512). In the stacked IC device 502, the first overhang region 134 is positioned on a side of the second die 114 opposite the second overhang region 434, and the first underhang region 504 is positioned on a side of the second die 114 opposite the second underhang region 512. In contrast, in FIG. 8, the first overhang region 134 is positioned on a side of the second die 114 that is adjacent to the second overhang region 434, and the first underhang region 504 is positioned on a side of the second die 114 that is adjacent to the second underhang region 512. As described with reference to FIG. 7, whether the arrangement of the stacked IC device 502 or the arrangement of the stacked IC device 802 is preferred may depend on, for example, locations of circuitry of the first die 104, locations of other devices that interact with the stacked IC device, as well as other factors.

Figure 9:
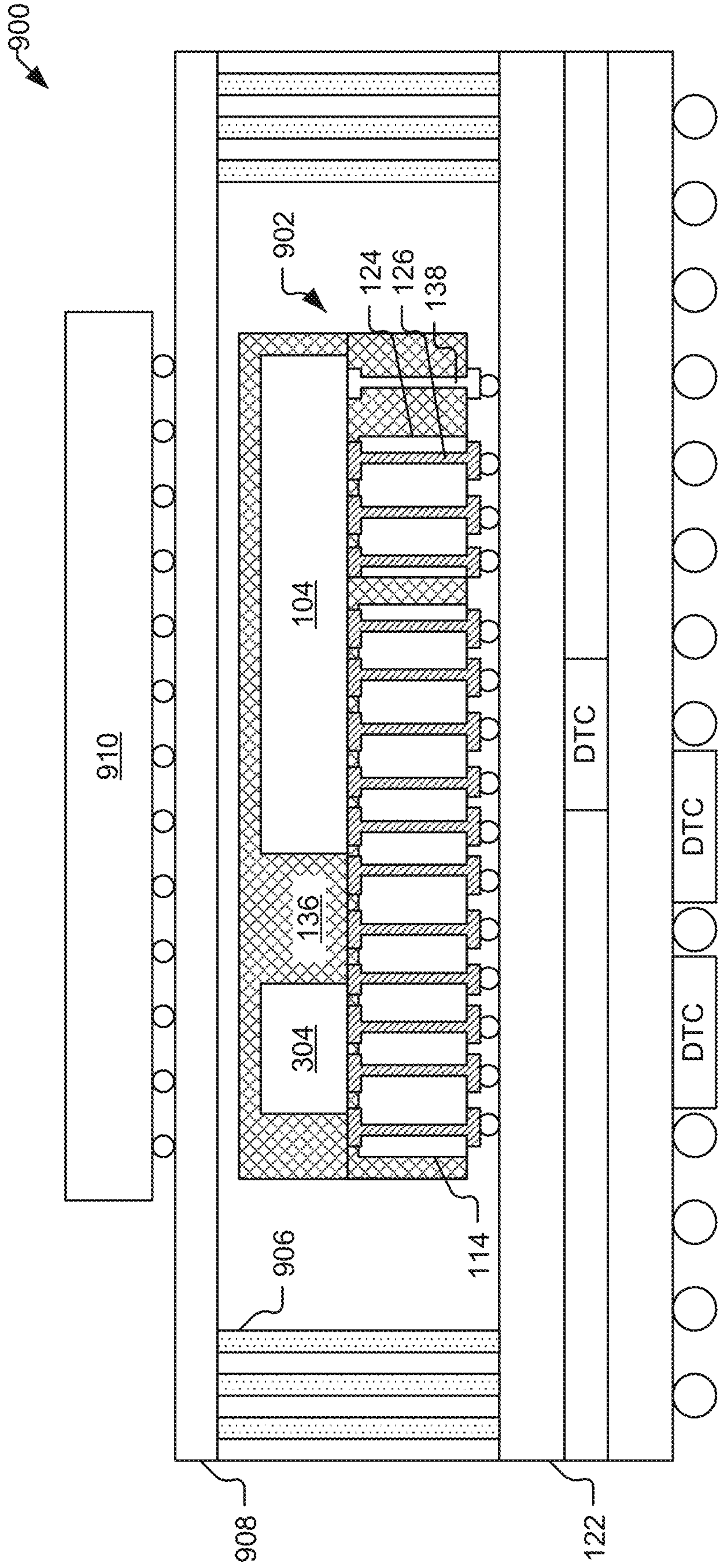
FIG. 9 illustrates a cross sectional profile view of a package-on-package device that includes an exemplary stacked IC device.

FIG. 9 illustrates a cross sectional profile view of a package-on-package device 900 that includes an exemplary stacked IC device 902. In various implementations, the stacked IC device 902 can include any of the stacked IC devices 102, 202, 302, 402, 502, 602, 702, or 802. For example, the stacked IC device 902 includes the first die 104, which can include various circuitry that is not shown in FIG. 9, such as the active circuitry 106, the PDN 108, I/O circuitry 142, etc. Likewise, the stacked IC device 902 includes the second die 114, which can include various circuitry that is not shown in FIG. 9, such as active circuitry, a PDN, I/O circuitry, etc. In FIG. 9, the second die 114 also includes the TSVs 162, which can be arranged to interconnect the first die 104 to the substrate 122, to connect an optional integrated device 304 to the substrate, or both. The stacked IC device 902 also includes the ICD 124 disposed in an overhang region (e.g., the overhang region 134 of FIG. 1) and electrically connected to a PDN of the first die 104. In FIG. 9, the stacked IC device 902 also includes the through-ICD conductor(s) 126 to electrically connect the PDN 108 to the substrate 122, and the stacked IC device 902 further includes the conductor(s) 138 passing through the mold compound 136 in the overhang region between the first die 104 and the substrate.

In FIG. 9, another device 910 is coupled to a substrate 908, and the stacked IC device 902 is disposed between the substrate 908 and the substrate 122. The substrate 908 can include a redistribution network to enable the device 910 to be connected to the substrate 122 via conductors 906. Thus, the package-on-package device 900 provides another mechanism to couple the stacked IC device 902 to other components.

While each of FIGS. 1A-9 illustrate examples of stacked IC devices that include at least two dies, in other examples, a stacked IC device can include more than two dies, and any two such dies can be positioned and interconnected as described herein. Further, while FIGS. 1A-4B and 9 illustrate stacked IC devices in the context of other devices (e.g., coupled via the substrate 122 to another device, such as the device 144 of FIG. 1A, the device 418 of FIG. 4A, and/or the device 910 of FIG. 9), the stacked IC devices disclosed herein can be integrated with or included within a wide variety of other devices. For example, a device that includes one or more of the stacked IC devices disclosed herein can include components such as a power management integrated circuit (PMIC), an application processor, a modem, a radio frequency (RF) device, a passive device, a filter, a capacitor, an inductor, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. In such devices, the stacked IC device can operate as any of these components (or a combination of these components) that includes active circuitry.

While each of FIGS. 1A-9 illustrate examples of stacked IC devices in which the ICD coupled to the upper die (e.g., the first die 104) includes through-ICD conductor(s), in some implementations, one or more ICDs used in a stacked IC device may not include through-ICD conductors. For example, in implementations that include two or more ICDs (such as the stacked IC device 402 that includes the ICD 124 and the ICD 404), one or more of the ICDs may include through-ICD conductors and one or more of the ICDs may not include through-ICD conductors. Alternatively, in some implementations, none of the ICDs include through-ICD conductors and the PDN 108 is coupled to the substrate 122 via other conductors, such as one or more TSVs of the second die 114 or one or more through mold conductors (e.g., the conductors 138). In some implementations, a stacked IC device can include one or more overhang regions that do not include ICDs. In some such implementations, one or more other overhang regions of the stacked IC device can include an ICD. In other implementations, the stacked IC device does not include ICDs disposed in any overhang region, in which case, the PDN 108 of the first die 104 can be coupled to capacitors of the substrate (e.g., the DTC 170 and/or the DTC 172) using through-mold vias (e.g., the conductors 138) that are coupled to the PDN 108 and extend through an overhang region.

While each of FIGS. 1A-9 illustrate examples of stacked IC devices that include the conductors (such as the conductor(s) 138 and the conductor(s) 408) through portions of the mold compound 136 in each overhang region, in some implementations, one or more of the overhang regions may not include such through mold conductors. For example, in implementations that include two or more overhang regions (such as the overhang region 134, the overhang region 434, and/or the overhang region 604), fewer than all of the overhang regions can include through mold conductors. For example, in FIG. 6, the overhang region 604 is illustrated without through mold conductors (e.g., TMVs). In some implementations, through mold conductors are entirely omitted and the I/O circuitry 142 of the first die 104 is coupled to the substrate 122 via other conductors, such as one or more TSVs of the second die 114 or through-ICD conductors.

Various examples above illustrate other devices (e.g., devices 144, 418) coupled to the substrate 122 adjacent to a stacked IC device (e.g., one of the stacked IC devices 102, 202, 302, 402, 502, 602, 702, 802, or 902). In each of the illustrated examples, the other device is illustrated as oriented such that sides of the other device are roughly parallel with sides of the stacked IC device. Put another way, the stacked IC device and the other device are shown as positioned side by side. However, in some implementations, the stacked IC device or the other device can be rotated (relative to this side-by-side orientation) such that a corner of one is oriented toward a side of the other (e.g., a corner of the stacked IC device is oriented toward a side of the other device or a corner of the other device is oriented toward the stacked IC device). For example, such a corner-to-side orientation can be used in some implementations in which the I/O circuitry 142 of the stacked IC device and/or the TMVs (e.g., the conductors 138, 408) are disposed along two adjacent edges of the stacked IC device, such as in the examples illustrated in FIGS. 7 and 8. To illustrate, in some such examples, the corner of the stacked IC device that is between the two adjacent edges can be oriented toward the side of the other device to provide short paths for interconnects between the other device and the TMVs and/or the I/O circuitry 142.

Exemplary Sequence for Fabricating a Stacked IC Device Including Integrated Capacitor Device In some implementations, fabricating a stacked IC device (e.g., any of the stacked IC devices 102, 202, 302, 402, 502, 602, 702, 802, or 902) includes several processes. FIG. 10 (which is continued across several pages) illustrates a first exemplary sequence for providing or fabricating a stacked IC device including at least one ICD, as described with reference to any of FIGS. 1A-9. In some implementations, the sequence of FIG. 10 may be used to provide (e.g., during fabrication of) one or more of the stacked IC devices 102, 202, 302, 402, 502, 602, 702, 802, or 902 of FIGS. 1A-9.

It should be noted that the sequence of FIG. 10 may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIG. 10. Each of the various stages of the sequence illustrated in FIG. 10 shows two stacked IC devices being formed concurrently (e.g., on a carrier 1006). In other implementations, a single stacked IC device can be formed alone, or more than two stacked IC devices can be formed together concurrently.

Stage 1 of FIG. 10 illustrates a state after one or more first dies 1002 (e.g., first dies 1002A and 1002B) and one or more integrated devices 1004 (e.g., devices 1004A and 1004B) have been coupled to the carrier 1006. In a particular implementation, the first dies 1002 include or correspond to instances of the first die 104 of any of FIGS. 1A-9. The integrated devices 1004 correspond to or include instances of the integrated device 304 of FIG. 3. The integrated devices 1004 are optional. For example, in implementations in which dies of the stacked IC device are not arranged to form an underhang region (e.g., the underhang region 208, the underhang region 504, or the underhang region 512), the integrated devices 1004 are omitted. In other implementations, an underhang region is formed by the dies but is not used to position an integrated device 1004. For example, in the stacked IC device 202, the underhang region 208 does not include an integrated device 1004.

Stage 2 illustrates a state after a mold compound 1008 is disposed on the carrier 1006 and between the first dies 1002 and the integrated devices 1004. For example, the mold compound 1008 can include a portion of (e.g., an upper layer of) the mold compound 136 of FIGS. 1A-9. In a particular example, a deposition process, a spin-on process, or a similar process can be used to apply the mold compound 1008, and the mold compound 1008 can subsequently be cured or hardened by exposure to light, heat, and/or chemical hardening agents.

Stage 3 illustrates a state after one or more interconnect layers 1010 are formed. The interconnect layer(s) 1010 can include redistribution layer(s) and/or electrical connectors (e.g., microbumps, conductive pads, or pillars) to form electrical connections to the first dies 1002 and/or the integrated devices 1004. The interconnect layer(s) 1010 can include a first set of contacts 1012A on a first side of the first die 1002A and the integrated device 1004A and can include a first set of contacts 1012B on a first side of the first die 1002B and the integrated device 1004B. One or more plating processes and one or more patterning processes may be used to form the interconnect layer(s) 1010.

Stage 4 illustrates a state after one or more second dies 1014 (e.g., second dies 1014A and 1014B) and one or more ICDs 1016 (e.g., ICDs 1016A and 1016B) have been positioned relative to the dies 1002 and the integrated devices 1004 and coupled to the interconnect layer(s) 1010. In a particular implementation, the second dies 1014 include or correspond to instances of the second die 114 of any of FIGS. 1A-9. The ICDs correspond to or include instances of the ICDs 124 or 404 of any of FIGS. 1A-9.

In the example illustrated in FIG. 10, the second die 1014A can include circuitry and vias 1018, which are electrically connected to contacts of the first set of contacts 1012A. Likewise, the ICD 1016A includes capacitors that are electrically connected, via the first set of contacts 1012A to a PDN of the first die 1002A and can also include through-ICD conductor(s) 1020 that are electrically connected to the first set of contacts 1012A. Similar connections are also formed at the first set of contacts 1012B.

Stage 5 illustrates a state after a mold compound 1022 is disposed on sidewalls of the second dies 1014 and ICDs 1016 and surfaces therebetween. For example, the mold compound 1022 can include a portion of (e.g., a lower layer of) the mold compound 136 of FIGS. 1A-9. In a particular example, a deposition process, a spin-on process, or a similar process can be used to apply the mold compound 1022, and the mold compound 1022 can subsequently be cured or hardened by exposure to light, heat, and/or chemical hardening agents.

Stage 6 illustrates a state after one or more openings 1024 (including opening(s) 1024A and opening(s) 1024B) have been formed in the mold compound 1022.

The openings 1024A expose underlying contacts 1026A of the first set of contacts 1012A, and the openings 1024B expose underlying contacts 1026B of the first set of contacts 1012B. The openings 1024 can be formed using patterning operations, etching processes, drilling operations, laser ablation operations, other targeted mold removal operations, or combinations thereof.

Stage 7 illustrates a state after deposition of conductors. For example, one or more plating processes and one or more patterning processes can be used to deposit conductors 1030 (including conductor(s) 1030A and conductor(s) 1030B) and conductors 1032 (including conductor(s) 1032A and 1032B). The conductors 1030 include or correspond to the conductor(s) 138 of any of FIGS. 1A-9. For example, the conductor(s) 1030A provide an electrical connection to the first die 1002A through the mold compound 1022, and the conductor(s) 1030B provide an electrical connection to the first die 1002B through the mold compound 1022. As such, the conductors 1030 can be referred to as through mold vias. The conductors 1032 correspond to a second set of contacts on a side of the second dies 1014 opposite the first dies 1002.

Stage 8 illustrates a state after formation of solder bumps 1040. For example, one or more plating processes and one or more patterning processes can be used form the solder bumps 1040. In the example illustrated in FIG. 10, the solder bumps 1040 include a grid or array of bumps including a first set of bumps 1042A providing electrical connections to circuitry of the second die 1014A, and by way of one or more vias of the second die 1014A to the integrated device 1004A and/or the first die 1002A.

In this example, the solder bumps 1040 also include a second set of bumps 1044A providing electrical connections to circuitry of the first die 1002A by way of the through-ICD vias 1020A, and third bumps 1046A providing electrical connections to circuitry of the first die 1002A by way of the conductor(s) 1030A. The solder bumps also include a first set of bumps 1042B, a second set of bumps 1044B, and a third set of bumps 1046B providing similar connections for the second die 1014B, the integrated device 1004B, the ICD 1016B, and the first die 1002B. In some implementations, conductive pillars (e.g., copper pillar) can be formed rather than solder bumps 1040 to arrive at Stage 8.

Stage 9 illustrates a state after separation of stacked IC devices 1050 (including stacked IC device 1050A and stacked IC device 1050B) from one another (and optionally from the carrier 1006). One or more delamination processes can be used to remove the stacked IC devices 1050 from the carrier 1006, and one or more cutting operations can be used to separate the stacked IC devices 1050 from one another.

Formation of the stacked IC devices 1050 is complete after stage 9 of FIG. 10. However, in some implementations, one or more of the stacked IC devices 1050 can be used to form a device 1060 corresponding to one of the devices 100, 200, 300, or 400 of FIGS. 1A-4B or the device 900 of FIG. 9. Stage 10 illustrates a state after formation of the device 1060, which can include flipping the stacked IC device 1050 to dispose the solder bumps 1040 adjacent to a substrate 1062 and heating/reflowing the solder bumps 1040 to connect the stacked IC device 1050 to the substrate 1062. One or more other devices 1064 can also be coupled to the substrate before, after, or at the same time that the stacked IC device 1050 is coupled to the substrate 1062.

FIG. 11 (which is continued across several pages) illustrates a second exemplary sequence for providing or fabricating a stacked IC device including at least one ICD, as described with reference to any of FIGS. 1A-9. In some implementations, the sequence of FIG. 11 may be used to provide (e.g., during fabrication of) one or more of the stacked IC devices 102, 202, 302, 402, 502, 602, 702, 802, or 902 of FIGS. 1A-9.

It should be noted that the sequence of FIG. 11 may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIG. 11. Each of the various stages of the sequence illustrated in FIG. 11 shows two stacked IC devices being formed concurrently (e.g., on a carrier 1106). In other implementations, a single stacked IC device can be formed alone, or more than two stacked IC devices can be formed together concurrently.

Stage 1 of FIG. 11 illustrates a state after one or more first dies 1102 (e.g., first dies 1102A and 1102B) and one or more integrated devices 1104 (e.g., devices 1104A and 1104B) have been coupled to the carrier 1106. In a particular implementation, the first dies 1102 include or correspond to instances of the first die 114 of any of FIGS. 1A-9. The integrated devices 1104 include or correspond to instances of the integrated device 304 of FIG. 3. The integrated devices 1104 are optional. For example, in implementations in which dies of the stacked IC device are not arranged to form an underhang region (e.g., the underhang region 208, the underhang region 504, or the underhang region 512), the integrated devices 1104 are omitted. In other implementations, an underhang region is formed by the dies but is not used to position an integrated device 1104. For example, in the stacked IC device 202, the underhang region 208 does not include an integrated device 1104.

Stage 2 illustrates a state after a mold compound 1108 is disposed on the carrier 1106 and between the first dies 1102 and the integrated devices 1104. For example, the mold compound 1108 can include a portion of (e.g., an upper layer of) the mold compound 136 of FIGS. 1A-9. In a particular example, a deposition process, a spin-on process, or a similar process can be used to apply the mold compound 1108, and the mold compound 1108 can subsequently be cured or hardened by exposure to light, heat, and/or chemical hardening agents.

Stage 3 illustrates a state after conductive posts 1110 are formed. The conductive posts 1110 are configured to form electrical connections to the first dies 1102 and/or the integrated devices 1104. In a particular aspect, the conductive posts 1110 include conductors 1130 (including conductors 1130A and conductors 1130B). One or more plating processes and one or more patterning processes may be used to form the conductive posts 1110. The conductors 1130 correspond to the conductor(s) 138 of any of FIGS. 1A-9. For example, the conductor(s) 1130A provide an electrical connection to the first die 1102A, and the conductor(s) 1130B provide an electrical connection to the first die 1102B.

Stage 4 illustrates a state after one or more second dies 1114 (e.g., second dies 1114A and 1114B) and one or more ICDs 1116 (e.g., ICDs 1116A and 1116B) have been positioned relative to the dies 1102 and the integrated devices 1104 and coupled to the conductive posts 1110. In a particular implementation, the second dies 1114 include or correspond to instances of the second die 114 of any of FIGS. 1A-9. The ICDs 1116 include or correspond to instances of the ICDs 124 or 404 of any of FIGS. 1A-9.

Stage 5 illustrates a state after a mold compound 1122 is disposed on sidewalls of the second dies 1114 and ICDs 1116 and surfaces therebetween. For example, the mold compound 1122 can include a portion of (e.g., a lower layer of) the mold compound 136 of FIGS. 1A-9. In a particular example, a deposition process, a spin-on process, or a similar process can be used to apply the mold compound 1122, and the mold compound 1122 can subsequently be cured or hardened by exposure to light, heat, and/or chemical hardening agents. The mold compound 1122 at least partially encapsulates the conductors 1130 to form through mold vias.

Stage 6 illustrates a state after forming conductive pillars 1132 (or other contacts). For example, one or more plating processes and one or more patterning processes can be used to deposit conductive pillars 1132 (including conductive pillars 1132A and 1132B). The conductive pillars 1132 correspond to a second set of contacts on a side of the second dies 1114 opposite the first dies 1102.

Stage 7 illustrates a state after formation of solder bumps 1140. For example, one or more plating processes and one or more patterning processes can be used form the solder bumps 1140. In the example illustrated in FIG. 11, the solder bumps 1140 include a grid or array of bumps including a first set of bumps 1142A providing electrical connections to circuitry of the second die 1114A, and by way of one or more vias of the second die 1114A to the integrated device 1104A and/or the first die 1102A.

In this example, the solder bumps 1140 also include a second set of bumps 1144A providing electrical connections to circuitry of the first die 1102A by way of through-ICD vias 1120A, and third bumps 1146A providing electrical connections to circuitry of the first die 1102A by way of the conductors 1130A (e.g., the through mold vias). The solder bumps 1140 also include a first set of bumps 1142B, a second set of bumps 1144B, and a third set of bumps 1146B providing similar connections for the second die 1114B, the integrated device 1104B, the ICD 1116B, and the first die 1102B. In some implementations, conductive pillars (e.g., copper pillar) can be formed rather than solder bumps 1040 to arrive at Stage 7.

Stage 8 illustrates a state after separation of stacked IC devices 1150 (including stacked IC device 1150A and stacked IC device 1150B) from one another (and optionally from the carrier 1106). One or more delamination processes can be used to remove the stacked IC devices 1150 from the carrier 1106, and one or more cutting operations can be used to separate the stacked IC devices 1150 from one another.

Formation of the stacked IC devices 1150 is complete after stage 8 of FIG. 11. However, in some implementations, one or more of the stacked IC devices 1150 can be used to form a device 1160 corresponding to one of the devices 100, 200, 300, or 400 of FIGS. 1A-4B or the device 900 of FIG. 9. Stage 9 illustrates a state after formation of the device 1160, which can include flipping the stacked IC device 1150 to dispose the solder bumps 1140 adjacent to a substrate 1162 and heating/reflowing the solder bumps 1140 to connect the stacked IC device 1150 to the substrate 1162. One or more other devices 1164 can also be coupled to the substrate 1162 before, after, or at the same time that the stacked IC device 1150 is coupled to the substrate 1162.

Exemplary Flow Diagram of a Method for Fabricating an Integrated Device Comprising Offset Interconnects In some implementations, fabricating a stacked IC device includes several processes. FIG. 12 illustrates an exemplary flow diagram of a method 1200 for providing or fabricating a stacked IC device. In some implementations, the method 1200 of FIG. 12 may be used to provide or fabricate any of the stacked IC devices 102, 202, 302, 402, 502, 602, 702, 802, or 902 of FIGS. 1A-9.

It should be noted that the method 1200 of FIG. 12 may combine one or more processes in order to simplify and/or clarify the method for providing or fabricating an integrated device. In some implementations, the order of the processes may be changed or modified.

The method 1200 includes, at block 1202, coupling a first side of a second die to a first side of a first die, where the first die includes a first set of contacts on the first side of the first die, active circuitry, and a power distribution network (PDN), and where the second die includes, on a second side of the second die, a second set of contacts to electrically connect circuitry of the second die to a substrate. For example, the first die and the second die can be fabricated and/or coupled together using one or more FEOL fabrication processes, one or more BEOL fabrication processes, or a combination thereof. In some implementations, Stage 4 of FIG. 10 and Stage 4 of FIG. 11 illustrate and describe examples of coupling a first side of a second die 1014 to a first side of a first die 1002. The first die of the method 1200 can include or correspond to the first die 104 of any of the stacked IC devices 102, 202, 302, 402, 502, 602, 702, 802, or 902. The second die of the method 1200 can include or correspond to the second die 114 of any of the stacked IC devices 102, 202, 302, 402, 502, 602, 702, 802, or 902.

The method 1200 includes, at block 1204, coupling, via the first set of contacts, an integrated capacitor device (ICD) to the first side of the first die, where the ICD includes one or more through-ICD conductors to electrically connect the PDN to the substrate. For example, the ICD can be fabricated and/or coupled to the first die using one or more FEOL fabrication processes, one or more BEOL fabrication processes, or a combination thereof. In some implementations, Stage 4 of FIG. 10 and Stage 4 of FIG. 11 illustrate and describe examples of coupling a first side of a second die 1014 to a first side of a first die 1002. The ICD of the method 1200 can include or correspond to the ICD 124 of any of the stacked IC devices 102, 202, 302, 402, 502, 602, 702, 802, or 902.

Exemplary Electronic Devices

FIG. 13 illustrates various electronic devices that may include or be integrated with any of the stacked IC devices 102, 202, 302, 402, 502, 602, 702, 802, or 902. For example, a mobile phone device 1302, a laptop computer device 1304, a fixed location terminal device 1306, a wearable device 1308, or a vehicle 1310 (e.g., an automobile or an aerial device) may include a device 1300. The device 1300 can include, for example, any of the devices 100, 200, 300, 400 or 900 and/or any of the stacked IC devices 102, 202, 302, 402, 502, 602, 702, 802, or 902 described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1-13 may be rearranged and/or combined into a single component, process, feature or function or embodied in several components, processes, or functions. Additional elements, components, processes, and/or functions may also be added without departing from the disclosure. It should also be noted FIGS. 1-13 and its corresponding description in the present disclosure is not limited to dies and/or ICs. In some implementations, FIGS. 1-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/ or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1 a stacked integrated circuit (IC) device includes a first die including active circuitry and a power distribution network (PDN), the first die having a first set of contacts on a first side of the first die; a second die coupled, on a first side of the second die, to the first side of the first die, wherein the second die includes, on a second side of the second die, a second set of contacts to electrically connect circuitry of the second die to a substrate; and an integrated capacitor device (ICD) coupled to the first side of the first die, wherein the ICD is electrically connected, via the first set of contacts, to the PDN and includes one or more through-ICD conductors to electrically connect the PDN to the substrate.

Example 2 includes the stacked IC device of Example 1, wherein at least one edge of the first die overhangs at least one edge of the second die to define an overhang region, and wherein the ICD is disposed within the overhang region.

Example 3 includes the stacked IC device of Example 1 or Example 2, further including mold compound at least partially encapsulating the first die, the second die, and the ICD to form a packaged IC device.

Example 4 includes the stacked IC device of Example 3, further including one or more conductors electrically connected to the first die and passing through the mold compound to provide an electrical connection between the first die and the substrate.

Example 5 includes the stacked IC device of Example 4, wherein the first die further includes input/output (I/O) circuitry, and the one or more conductors are connected to the I/O circuitry to provide a data path between the first die and another device that is coupled to the substrate (or to another device on a printed circuit board).

Example 6 includes the stacked IC device of Example 4 or Example 5, further including a ball grid array (BGA), wherein the BGA includes or is directly connected to the second set of contacts of the second die, the one or more through-ICD conductors, and the one or more conductors.

Example 7 includes the stacked IC device of any of Examples 1 to 6, wherein the ICD includes one or more trench capacitors in a semiconductor substrate.

Example 8 includes the stacked IC device of Example 7, wherein the one or more through-ICD conductors include vias through the semiconductor substrate.

Example 9 includes the stacked IC device of any of Examples 1 to 6, wherein the ICD includes one or more multilayer ceramic capacitors.

Example 10 includes the stacked IC device of any of Examples 1 to 6, wherein the ICD includes a third die.

Example 11 includes the stacked IC device of any of Examples 1 to 10, wherein at least two edges of the first die overhang at least two edges of the second die to define at least two overhang regions, and wherein the ICD is disposed within a first overhang region of the at least two overhang regions, and further including another integrated device disposed within a second overhang region of the at least two overhang regions.

Example 12 includes the stacked IC device of Example 11, wherein the other integrated device includes a second ICD.

Example 13 includes the stacked IC device of Example 12, further including a first set of conductors disposed within the first overhang region and distinct from the ICD, and a second set of conductors disposed within the second overhang region and distinct from the second ICD, wherein the first set of conductors and the second set of conductors are configured to provide electrical connections between the first die and the substrate.

Example 14 includes the stacked IC device of any of Examples 11 to 13, wherein the second die is disposed between the first overhang region and the second overhang region.

Example 15 includes the stacked IC device of any of Examples 1 to 14, wherein at least one edge of the second die extends past at least one edge of the first die to define at least one underhang region, and further including another integrated device disposed within the at least one underhang region.

Example 16 includes the stacked IC device of Example 15, wherein the other integrated device includes a second ICD.

Example 17 includes the stacked IC device of any of Examples 1 to 16, further including a third set of contacts on the first side of the second die, wherein the third set of contacts electrically connect the active circuitry of the first die to the circuitry of the second die.

Example 18 includes the stacked IC device of Example 17, wherein the third set of contacts include microbumps.

Example 19 includes the stacked IC device of Example 17, wherein the third set of contacts include conductive pillars.

Example 20 includes the stacked IC device of any of Examples 17 to 19, wherein the second die includes one or more through silicon vias (TSVs) connecting one or more contacts of the third set of contacts to one or more contacts of the second set of contacts to electrically connect the active circuitry of the first die to the substrate.

Example 21 includes the stacked IC device of any of Examples 1 to 20, further including, on a second side of the first die, a fourth set of contacts to electrically connect the stacked IC device to another device.

Example 22 includes the stacked IC device of any of Examples 1 to 21, wherein the first die is a first chiplet and the second die is a second chiplet designed to operate in conjunction with the first chiplet.

Example 23 includes the stacked IC device of Example 22, wherein the active circuitry of the first chiplet includes one or more first functional circuit blocks and the circuitry of the second chiplet includes one or more second functional circuit blocks, and wherein the one or more first functional circuit blocks and the one or more second functional circuit blocks are operationally dependent upon one another.

According to Example 24, a device includes a stacked integrated circuit (IC) device, including: a first die including active circuitry and a power distribution network (PDN), the first die having a first set of contacts on a first side of the first die; a second die coupled, on a first side of the second die, to the first side of the first die, wherein the second die includes, on a second side of the second die, a second set of contacts to electrically connect circuitry of the second die to a substrate; and an integrated capacitor device (ICD) coupled to the first side of the first die, wherein the ICD is electrically connected, via the first set of contacts, to the PDN and includes one or more through-ICD conductors to electrically connect the PDN to the substrate.

Example 25 includes the device of Example 24, further including the substrate, and at least one second device electrically connected to the stacked IC device via one or more conductive traces of the substrate.

Example 26 includes the device of Example 24 or Example 25, wherein at least one edge of the first die overhangs at least one edge of the second die to define an overhang region, and wherein the ICD is disposed within the overhang region.

Example 27 includes the device of any of Examples 24 to 26, further including mold compound at least partially encapsulating the first die, the second die, and the ICD to form a packaged IC device.

Example 28 includes the device of Example 27, further including one or more conductors electrically connected to the first die and passing through the mold compound to provide an electrical connection between the first die and the substrate.

Example 29 includes the device of Example 28, wherein the first die further includes input/output (I/O) circuitry, and the one or more conductors are connected to the I/O circuitry to provide a data path between the first die and another device that is coupled to the substrate (or to another device on a printed circuit board).

Example 30 includes the device of Example 28 or Example 29, further including a ball grid array (BGA), wherein the BGA includes or is directly connected to the second set of contacts of the second die, the one or more through-ICD conductors, and the one or more conductors.

Example 31 includes the device of any of Examples 24 to 30, wherein the ICD includes one or more trench capacitors in a semiconductor substrate.

Example 32 includes the device of Example 31, wherein the one or more through-ICD conductors include vias through the semiconductor substrate.

Example 33 includes the device of any of Examples 24 to 30, wherein the ICD includes one or more multilayer ceramic capacitors.

Example 34 includes the device of any of Examples 24 to 30, wherein the ICD includes a third die.

Example 35 includes the device of any of Examples 24 to 34, wherein at least two edges of the first die overhang at least two edges of the second die to define at least two overhang regions, and wherein the ICD is disposed within a first overhang region of the at least two overhang regions, and further including another integrated device disposed within a second overhang region of the at least two overhang regions.

Example 36 includes the device of Example 35, wherein the other integrated device includes a second ICD.

Example 37 includes the device of Example 36, further including a first set of conductors disposed within the first overhang region and distinct from the ICD, and a second set of conductors disposed within the second overhang region and distinct from the second ICD, wherein the first set of conductors and the second set of conductors are configured to provide electrical connections between the first die and the substrate.

Example 38 includes the device of any of Examples 35 to 37, wherein the second die is disposed between the first overhang region and the second overhang region.

Example 39 includes the device of any of Examples 24 to 38, wherein at least one edge of the second die extends past at least one edge of the first die to define at least one underhang region, and further including another integrated device disposed within the at least one underhang region.

Example 40 includes the device of Example 39, wherein the other integrated device includes a second ICD.

Example 41 includes the device of any of Examples 24 to 40, further including a third set of contacts on the first side of the second die, wherein the third set of contacts electrically connect the active circuitry of the first die to the circuitry of the second die.

Example 42 includes the device of Example 41, wherein the third set of contacts includes microbumps.

Example 43 includes the device of Example 41, wherein the third set of contacts includes conductive pillars.

Example 44 includes the device of any of Examples 41 to 43, wherein the second die includes one or more through silicon vias (TSVs) connecting one or more contacts of the third set of contacts to one or more contacts of the second set of contacts to electrically connect the active circuitry of the first die to the substrate.

Example 45 includes the device of any of Examples 24 to 44, further including, on a second side of the first die, a fourth set of contacts to electrically connect the stacked IC device to another device.

Example 46 includes the device of any of Examples 24 to 45, wherein the first die is a first chiplet and the second die is a second chiplet designed to operate in conjunction with the first chiplet.

Example 47 includes the device of Example 46, wherein the active circuitry of the first chiplet includes one or more first functional circuit blocks and the circuitry of the second chiplet includes one or more second functional circuit blocks, and wherein the one or more first functional circuit blocks and the one or more second functional circuit blocks are operationally dependent upon one another.

According to Example 48, a method of fabricating a stacked integrated circuit (IC) device includes: coupling a first side of a second die to a first side of a first die, wherein the first die includes a first set of contacts on the first side of the first die, active circuitry, and a power distribution network (PDN), and wherein the second die includes, on a second side of the second die, a second set of contacts to electrically connect circuitry of the second die to a substrate; and coupling, via the first set of contacts, an integrated capacitor device (ICD) to the first side of the first die, wherein the ICD includes one or more through-ICD conductors to electrically connect the PDN to the substrate.

Example 49 includes the method of Example 48, wherein at least one edge of the first die overhangs at least one edge of the second die to define an overhang region, and wherein the ICD is disposed within the overhang region.

Example 50 includes the method of Example 48 or Example 49, further including at least partially encapsulating the first die, the second die, and the ICD to form a packaged IC device.

Example 51 includes the method of Example 50, further including providing an electrical connection between the first die and the substrate via one or more conductors that pass through mold compound.

Example 52 includes the method of Example 51, wherein the first die further includes input/output (I/O) circuitry, and the one or more conductors are connected to the I/O circuitry to provide a data path between the first die and another device that is coupled to the substrate (or to another device on a printed circuit board).

Example 53 includes the method of any of Examples 48 to 52, wherein the ICD includes one or more trench capacitors in a semiconductor substrate.

Example 54 includes the method of Example 53, wherein the one or more through-ICD conductors include vias through the semiconductor substrate.

Example 55 includes the method of any of Examples 48 to 52, wherein the ICD includes one or more multilayer ceramic capacitors.

Example 56 includes the method of any of Examples 48 to 52, wherein the ICD includes a third die.

Example 57 includes the method of any of Examples 48 to 56, wherein at least two edges of the first die overhang at least two edges of the second die to define at least two overhang regions, and wherein the ICD is disposed within a first overhang region of the at least two overhang regions, and further including disposing another integrated device within a second overhang region of the at least two overhang regions.

Example 58 includes the method of Example 57, wherein the other integrated device includes a second ICD.

Example 59 includes the method of Example 58, further including providing a first set of conductors disposed within the first overhang region and distinct from the ICD, and providing a second set of conductors disposed within the second overhang region and distinct from the second ICD, wherein the first set of conductors and the second set of conductors are configured to provide electrical connections between the first die and the substrate.

Example 60 includes the method of any of Examples 57 to 59, wherein the second die is disposed between the first overhang region and the second overhang region.

Example 61 includes the method of any of Examples 48 to 60, wherein at least one edge of the second die extends past at least one edge of the first die to define at least one underhang region, and further including placing another integrated device within the at least one underhang region.

Example 62 includes the method of Example 61, wherein the other integrated device includes a second ICD.

Example 63 includes the method of any of Examples 48 to 62, further including providing a third set of contacts on the first side of the second die, wherein the third set of contacts electrically connects the active circuitry of the first die to the circuitry of the second die.

Example 64 includes the method of Example 63, wherein the third set of contacts includes microbumps.

Example 65 includes the method of Example 63, wherein the third set of contacts includes conductive pillars.

Example 66 includes the method of any of Examples 63 to 65, wherein the second die includes one or more through silicon vias (TSVs) connecting one or more contacts of the third set of contacts to one or more contacts of the second set of contacts to electrically connect the active circuitry of the first die to the substrate.

Example 67 includes the method of any of Examples 48 to 66, further including connecting a fourth set of contacts, on a second side of the first die, to another device.

Example 68 includes the method of any of Examples 48 to 67, wherein the first die is a first chiplet and the second die is a second chiplet designed to operate in conjunction with the first chiplet.

Example 69 includes the method of Example 68, wherein the active circuitry of the first chiplet includes one or more first functional circuit blocks and the circuitry of the second chiplet includes one or more second functional circuit blocks, and wherein the one or more first functional circuit blocks and the one or more second functional circuit blocks are operationally dependent upon one another.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A stacked integrated circuit (IC) device comprising:

a first die including active circuitry and a power distribution network (PDN), the first die having a first set of contacts on a first side of the first die;

a second die coupled, on a first side of the second die, to the first side of the first die, wherein the second die includes, on a second side of the second die, a second set of contacts to electrically connect circuitry of the second die to a substrate; and an integrated capacitor device (ICD) coupled to the first side of the first die, wherein the ICD is electrically connected, via the first set of contacts, to the PDN and includes one or more through-ICD conductors to electrically connect the PDN to the substrate, wherein at least one edge of the first die overhangs at least one edge of the second die to define an overhang region, and wherein the ICD is disposed within the overhang region.

2. The stacked IC device of claim 1, further comprising one or more first solder balls and one or more second solder balls, wherein the first die is coupled to the second die using the one or more first solder balls, and wherein the ICD is coupled to the first die using the one or more second solder balls.

3. The stacked IC device of claim 1, further comprising a single layer mold compound at least partially encapsulating the first die, the second die, and the ICD to form a packaged IC device.

4. The stacked IC device of claim 3, further comprising one or more through-mold vias (TMVs) electrically connected to the first die and passing through only the single layer mold compound to provide an electrical connection between the first die and the substrate.

5. The stacked IC device of claim 1, wherein at least two edges of the first die overhang at least two edges of the second die to define at least two overhang regions, and wherein the ICD is disposed within a first overhang region of the at least two overhang regions, and further comprising another integrated device disposed within a second overhang region of the at least two overhang regions.

6. The stacked IC device of claim 5, wherein the other integrated device includes a second ICD.

7. The stacked IC device of claim 6, further comprising a first set of through-mold vias (TMVs) disposed within the first overhang region and distinct from the ICD, and a second set of TMVs disposed within the second overhang region and distinct from the second ICD, wherein the first set of TMVs and the second set of TMVs are configured to provide electrical connections between the first die and the substrate.

8. The stacked IC device of claim 5, wherein the second die is disposed between the first overhang region and the second overhang region.

9. The stacked IC device of claim 1, wherein at least one edge of the second die extends past at least one edge of the first die to define at least one underhang region, and further comprising another integrated device disposed within the at least one underhang region.

10. The stacked IC device of claim 1, further comprising a third set of contacts on the first side of the second die, wherein the third set of contacts electrically connect the active circuitry of the first die to the circuitry of the second die.

11. The stacked IC device of claim 10, wherein the second die includes one or more through silicon vias (TSVs) connecting one or more contacts of the third set of contacts to one or more contacts of the second set of contacts to electrically connect the active circuitry of the first die to the substrate.

12. The stacked IC device of claim 1, further comprising, on a second side of the first die, a fourth set of contacts to electrically connect the stacked IC device to another device.

13. The stacked IC device of claim 1, wherein the first die is a first chiplet and the second die is a second chiplet configured to operate in conjunction with the first chiplet.

14. The stacked IC device of claim 13, wherein the active circuitry of the first chiplet includes one or more first functional circuit blocks and the circuitry of the second chiplet includes one or more second functional circuit blocks, and wherein the one or more first functional circuit blocks and the one or more second functional circuit blocks are operationally dependent upon one another.

15. A device comprising:

a stacked integrated circuit (IC) device, comprising:

a first die including active circuitry and a power distribution network (PDN), the first die having a first set of contacts on a first side of the first die;

a second die coupled, on a first side of the second die, to the first side of the first die, wherein the second die includes, on a second side of the second die, a second set of contacts to electrically connect circuitry of the second die to a substrate; and an integrated capacitor device (ICD) coupled to the first side of the first die, wherein the ICD is electrically connected, via the first set of contacts, to the PDN and includes one or more through-ICD conductors to electrically connect the PDN to the substrate, wherein at least one edge of the first die overhangs at least one edge of the second die to define an overhang region, and wherein the ICD is disposed within the overhang region.

16. The device of claim 15, further comprising the substrate, and at least one second device electrically connected to the stacked IC device via one or more conductive traces of the substrate.

17. The device of claim 15, further comprising one or more first solder balls and one or more second solder balls, wherein the first die is coupled to the second die using the one or more first solder balls, and wherein the ICD is coupled to the first die using the one or more second solder balls.

18. The device of claim 15, further comprising a single layer mold compound at least partially encapsulating the first die, the second die, and the ICD to form a packaged IC device.

19. The device of claim 18, further comprising one or more through-mold vias (TMVs) electrically connected to the first die and passing through only the single layer mold compound to provide an electrical connection between the first die and the substrate.

20. The device of claim 19, wherein the first die further includes input/output (I/O) circuitry, and the one or more TMVs are connected to the I/O circuitry to provide a data path between the first die and another device that is coupled to the substrate.

21. The device of claim 15, wherein at least two edges of the first die overhang at least two edges of the second die to define at least two overhang regions, and wherein the ICD is disposed within a first overhang region of the at least two overhang regions, and further comprising another integrated device disposed within a second overhang region of the at least two overhang regions.

22. The device of claim 21, wherein the second die is disposed between the first overhang region and the second overhang region.

23. The device of claim 15, wherein at least one edge of the second die extends past at least one edge of the first die to define at least one underhang region, and further comprising another integrated device disposed within the at least one underhang region.

24. The device of claim 15, further comprising a third set of contacts on the first side of the second die, wherein the third set of contacts electrically connect the active circuitry of the first die to the circuitry of the second die.

25. The device of claim 15, further comprising, on a second side of the first die, a fourth set of contacts to electrically connect the stacked IC device to another device.

26. The device of claim 15, wherein the first die is a first chiplet and the second die is a second chiplet configured to operate in conjunction with the first chiplet.

27. The device of claim 26, wherein the active circuitry of the first chiplet includes one or more first functional circuit blocks and the circuitry of the second chiplet includes one or more second functional circuit blocks, and wherein the one or more first functional circuit blocks and the one or more second functional circuit blocks are operationally dependent upon one another.

28. A method of fabricating a stacked integrated circuit (IC) device, the method comprising:

coupling a first side of a second die to a first side of a first die, wherein the first die includes a first set of contacts on the first side of the first die, active circuitry, and a power distribution network (PDN), wherein the second die includes, on a second side of the second die, a second set of contacts to electrically connect circuitry of the second die to a substrate, and wherein at least one edge of the first die overhangs at least one edge of the second die to define an overhang region; and coupling, via the first set of contacts, an integrated capacitor device (ICD) to the first side of the first die, wherein the ICD includes one or more through-ICD conductors to electrically connect the PDN to the substrate, and wherein the ICD is disposed within the overhang region.

29. The method of claim 28, wherein coupling the first side of the second die to the first side of the first die comprises forming one or more first solder balls that couple the first die to the second die, and wherein coupling the ICD to the first side of the first die comprises forming one or more second solder balls that couple the ICD to the first die.

30. The method of claim 28, further comprising at least partially encapsulating the first die, the second die, and the ICD in a single layer mold compound.

* * * * *